(12) United States Patent
Eltaliawy et al.

(10) Patent No.: US 11,894,968 B2
(45) Date of Patent: Feb. 6, 2024

(54) INPHASE QUADRATURE CURRENT SELECTOR AMPLIFIERS FOR WIRELESS COMMUNICATION

(71) Applicant: Swiftlink Technologies Inc., Richmond (CA)

(72) Inventors: Ayman Eltaliawy, Richmond (CA); Min-Yu Huang, Richmond (CA)

(73) Assignee: SWIFTLINK TECHNOLOGIES INC., Richmond (CA)

( * ) Notice: Subject to any disclaimer, the term of this patent is extended or adjusted under 35 U.S.C. 154(b) by 0 days.

(21) Appl. No.: 17/589,090

(22) Filed: Jan. 31, 2022

(65) Prior Publication Data
US 2023/0246898 A1    Aug. 3, 2023

(51) Int. Cl.
*H04L 27/36* (2006.01)
*H03F 3/24* (2006.01)
*H03F 3/16* (2006.01)
*H04B 1/38* (2015.01)

(52) U.S. Cl.
CPC ............... *H04L 27/36* (2013.01); *H03F 3/16* (2013.01); *H03F 3/245* (2013.01); *H04B 1/38* (2013.01); *H03F 2200/336* (2013.01)

(58) Field of Classification Search
CPC ... H04B 1/38; H04L 27/36; H03F 3/16; H03F 3/245; H03F 2200/336
See application file for complete search history.

(56) References Cited

U.S. PATENT DOCUMENTS

| 10,411,745 | B1 | 9/2019 | Huang et al. | |
| 10,707,817 | B2 | 7/2020 | Huang et al. | |
| 2004/0058661 | A1* | 3/2004 | Hsu | H04B 1/30 455/196.1 |
| 2020/0119742 | A1* | 4/2020 | Jain | G06F 1/06 |
| 2020/0229088 | A1* | 7/2020 | Wang | H04W 52/0225 |
| 2020/0266538 | A1* | 8/2020 | Okada | H03D 7/1466 |

* cited by examiner

*Primary Examiner* — David S Huang
(74) *Attorney, Agent, or Firm* — WOMBLE BOND DICKINSON (US) LLP

(57) ABSTRACT

A transmit in-phase quadrature (IQ) amplifier includes a common gain stage to receive an input signal and to generate an amplified signal. The amplifier includes an IQ poly-phase filter coupled to the common gain stage to receive the amplified signal from the common gain stage and outputs a four-phase signal. The amplifier includes an in-phase (I) phase switching gain stage coupled to the IQ poly-phase filter to receive I components of the four-phase signal and outputs an amplified phase switching I signal. The amplifier includes a quadrature (Q) phase switching gain stage coupled to the IQ poly-phase filter to receive Q components of the four-phase signal and outputs an amplified phase switching Q signal.

20 Claims, 17 Drawing Sheets

INPHASE QUADRATURE CURRENT SELECTOR AMPLIFIERS FOR WIRELESS COMMUNICATION

FIELD OF THE INVENTION

Embodiments of the present invention relate generally to wireless communication devices. More particularly, embodiments of the invention relate to an in-phase quadrature current selector transmit/receive amplifiers for wireless communication.

BACKGROUND

With the persistent market demand for higher data rates, target precision, compact systems, and so on, wireless research is rapidly progressing to embrace the millimeter-wave (mmW) and beyond frequency bands. These bands are inherently capable of satisfying these requirements and thereby support the emerging applications such as 5G new radio (5G NR), automotive radar, mmW imaging, high speed indoor communications, and beyond.

5G NR technology has shown significant potential in the mmW bands: 24.5 Gigahertz (GHz)-29.5 GHz and 37 GHz-43 GHz, due to the continuous demand for ultra-high-speed data rate communications (i.e., >10 gigabits per seconds (Gbps)). The free space path loss (FSPL) for mmW signals in those bands is usually high (i.e., >100 decibels (dB)), as a result phased-antenna arrays are employed to satisfy the link budget requirements. A radio frequency integrated circuit (RFIC) front-end architecture can be adopted based on full-band continuous coverage: 24.5 GHz-43 GHz, but frequency translation requires an instantaneous In-phase/Quadrature (IQ) image rejection technique.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
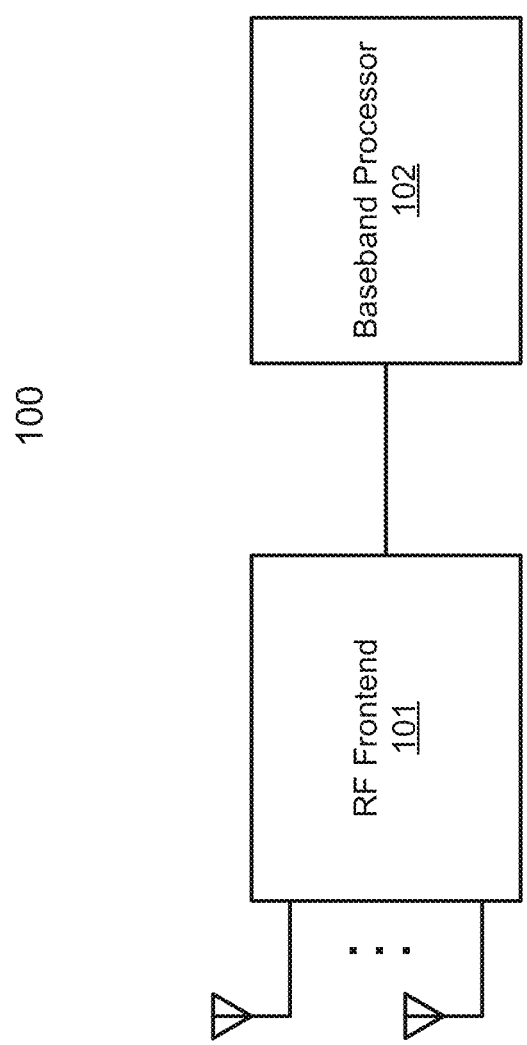
FIG. 1 is a block diagram illustrating an example of a wireless communication device according one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Note that in the corresponding drawings of the embodiments, signals are represented with lines. Some lines may be thicker or have a slash over the lines, to indicate more constituent signal paths, such as a differential signal, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

Embodiments of the specification disclose a passive phase switching transmit IQ amplifier, a passive phase switching receive IQ amplifier, a cascode current-selector amplifier, an active phase switching transmit IQ amplifier, an active phase switching receive IQ amplifier, a stacked current-selector transmit IQ amplifier, and a stacked current-selector receive IQ amplifier. The co-design schemes are proposed to implement IQ signal amplification, inversion, and filtering using phase switching passive switches or phase switching active cascode amplifier stages.

Dual-band continuous-time image rejection can be realized by opposite in-phase quadrature (IQ) local oscillator (LO) injection scenarios during signal up/down conversion. By fixing an Intermediate Frequency (IF) frequency at 7.5 GHz, low-side LO injection (e.g., freq_LO=_freq_RF−freq_IF) for the 37-43 GHz band can be realized when LO frequency ranges between 29.5 and 35.5 GHz. High-side LO injection (e.g., freq_LO=freq_RF+freq_IF) for the 24.5-29.5 GHz band can be realized when LO frequency ranges between 32 and 37 GHz. For the low-side LO injection, the differential I or Q components (or simply I or Q signals) of the up/down converted IF signal have to be in-phase to retrieve the original received/transmitted signal. For the high-side LO injection, either the I or Q component of the up/down converted IF signal has to be 180 degrees out-of-phase. Based on the aforementioned signal conversion techniques, IQ phase switching can maintain proper image rejection across the dual-band in frequency range 24.5-43 GHz using a same amplifier implemented for the dual-band frequency range.

Figure 5A:
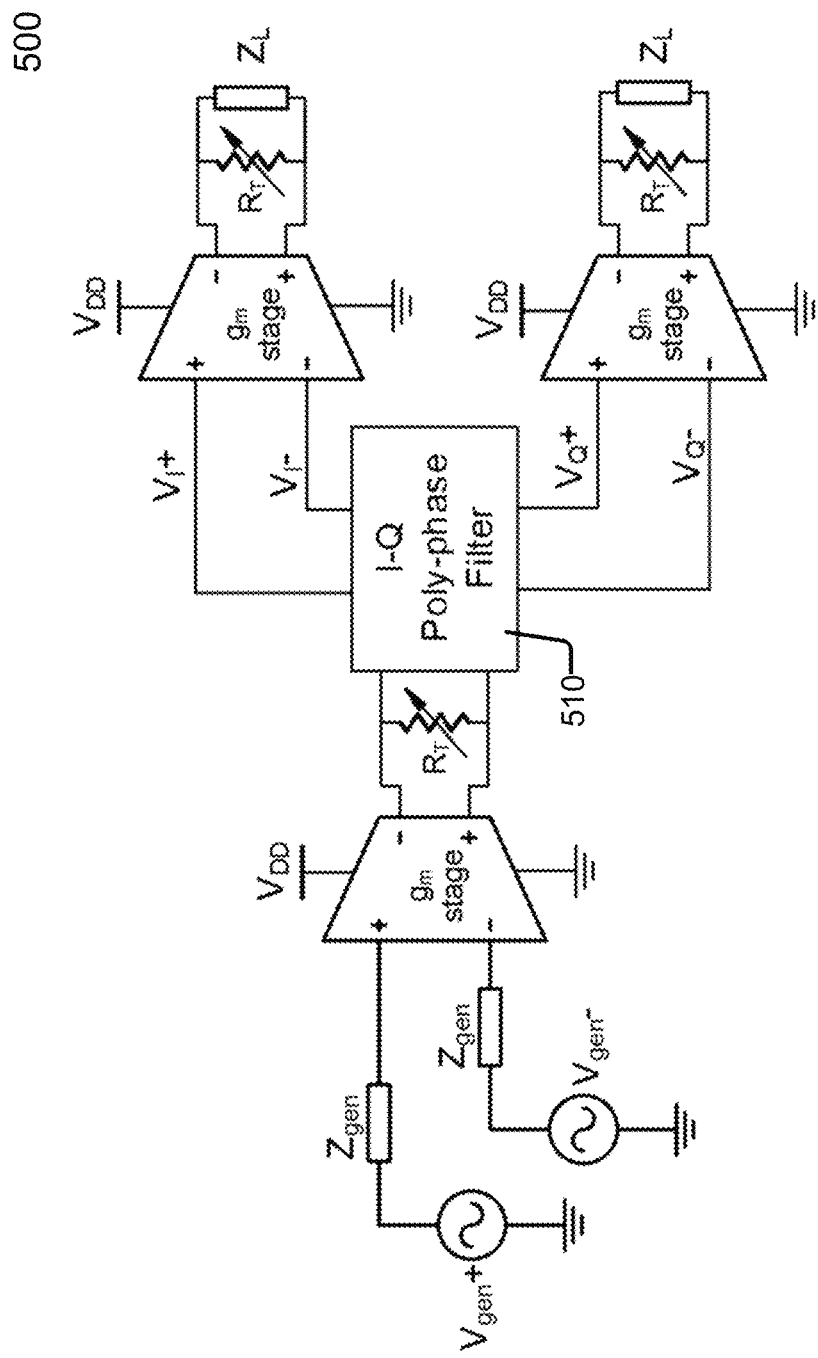
FIG. 5A illustrates a block diagram of a transmit IQ amplifier.
Figure 5B:
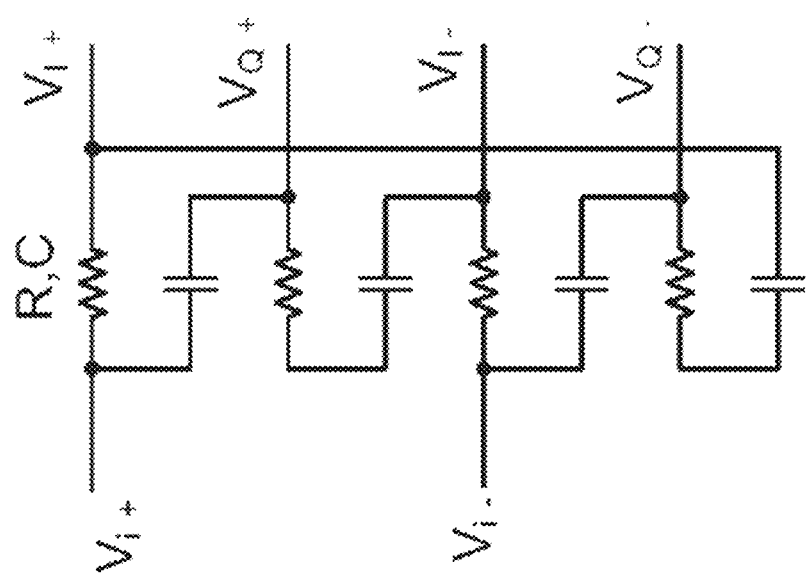
FIG. 5B illustrates a block diagram of an IQ poly-phase filter.
Figure 6:
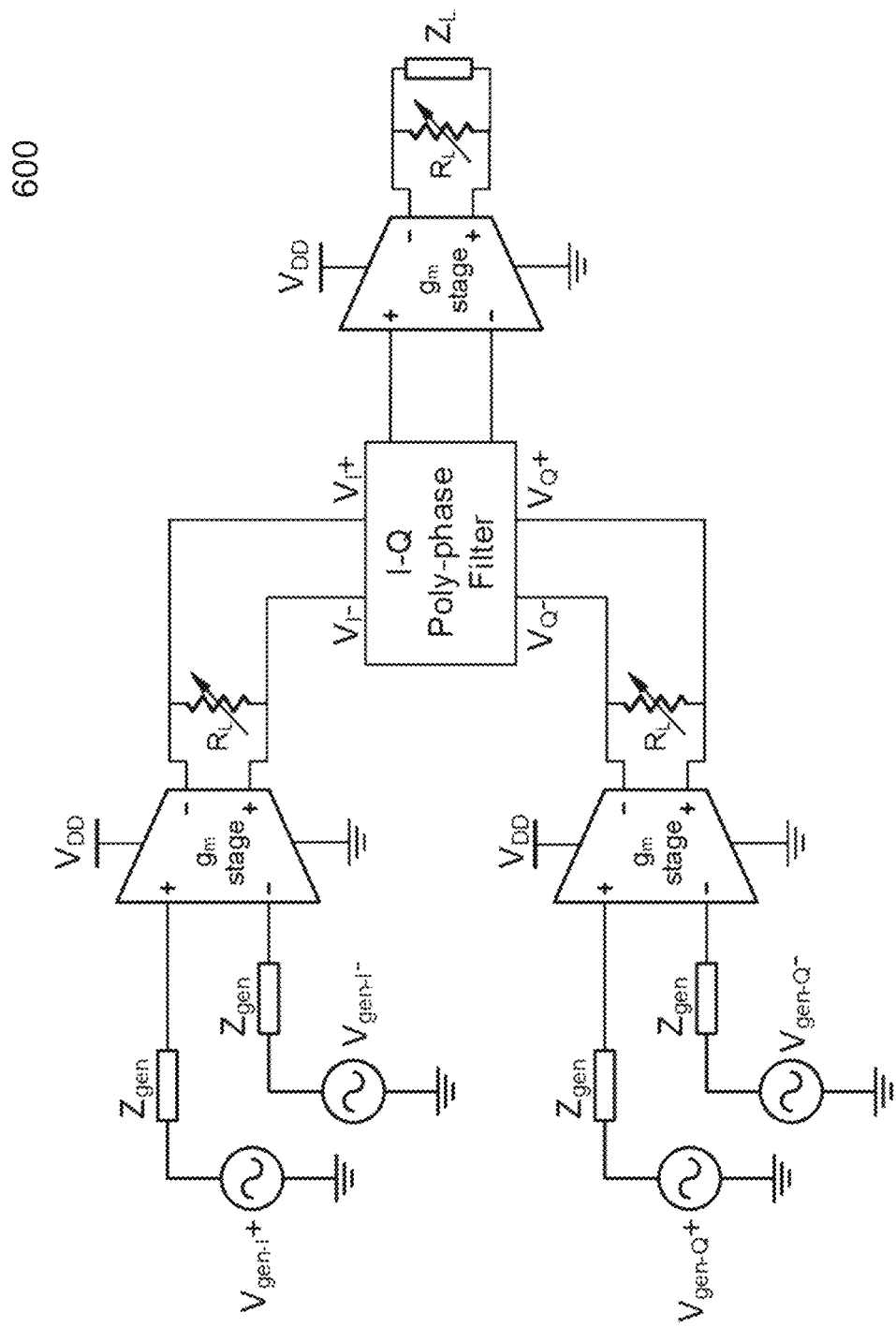
FIG. 6 illustrates a block diagram of a receive IQ amplifier.

FIG. 5A shows a block diagram of a conventional frequency-tuned transmit IQ amplifier 500 coupled to a generator source ($V_{gen}$), a generator impedance ($Z_{gen}$), and a load impedance ($Z_L$). Amplifier 500 includes cascaded stages of trans-conductance amplifier loaded with a variable resistance ($R_T$) for gain tuning and an IQ poly-phase filter 510, which generates the differential IQ signals. IQ poly-phase filter 510 can be realized using a resistance capacitance (RC) network (shown in FIG. 5B) at the IF frequency band, or using a resistance-inductance (RL) network (not shown) at the mm-wave frequency band. FIG. 6 shows a block diagram of a conventional frequency-tuned receive IQ amplifier. The receive IQ amplifier combines the differential IQ signals using the IQ poly-phase filter to construct the IF/RF signal. Here, the cascaded blocks of the IQ receive amplifier are the same as the IQ transmit amplifier in reverse order. Note that the generator source ($V_{gen}$) is typically available in differential form, and $Z_{gen}$ and $Z_L$ are typically 50Ω.

Embodiments discloses phase switching implementations for the transmit/receive IQ amplifiers (500, 600) using a double-pole double-throw switch (DPDT) for passive signal inversion or a current-selector cascode gm-stage for active signal inversion.

According to a first aspect, a transmit in-phase quadrature (IQ) amplifier includes a common gain stage to receive an input signal and to generate an amplified signal. The amplifier includes an IQ poly-phase filter coupled to the common gain stage to receive the amplified signal from the common gain stage and outputs a four-phase signal. The amplifier includes an in-phase (I) phase switching gain stage coupled to the IQ poly-phase filter to receive I components of the four-phase signal and outputs an amplified phase switching I signal. The amplifier includes a quadrature (Q) phase switching gain stage coupled to the IQ poly-phase filter to receive Q components of the four-phase signal and outputs an amplified phase switching Q signal.

In one embodiment, the I or Q phase switching gain stage comprises a passive phase switching component or an active phase switching component. In one embodiment, the I or Q phase switching gain stage includes a double-pole double-throw switch to receive either the I or Q components of the four-phase signal and generates a phase switching I or Q signal, and a trans-conductance amplifier coupled to the doubled-pole double-throw switch to receive the phase switching I or Q signal from the doubled-pole double-throw switch and outputs the amplified phase switching I or Q signal.

In one embodiment, the double-pole double-throw switch comprises two fully-differential single-pole single-throw switches. In one embodiment, the I or Q phase switching gain stage comprises a cascode selector amplifier.

In one embodiment, the cascode selector amplifier includes a trans-conductance stage to receive a balanced input signal ($V_i^+$, $V_i^-$) and generates an amplified signal, an active switching circuit coupled to the trans-conductance stage to receive the amplified signal from the trans-conductance stage and outputs a balanced phase switching signal at output ports ($V_o^+$, $V_o^-$), and a biasing circuit coupled to the trans-conductance stage to provide a variable bias signal to the trans-conductance stage.

In one embodiment, the trans-conductance stage comprises a first and a second transistors, each having source terminals coupled to a common node that is coupled to the biasing circuit, gate terminals to receive a corresponding component of the balanced input signal ($V_i^+$, $V_i^-$), and drain terminals coupled to the active switching circuit.

In one embodiment, the active switching circuit includes a third and a fourth transistors, each having source terminals coupled to a drain terminal of a first transistor, a gate terminal of the third transistor is coupled to a control voltage ($V_{ctrl}$), a gate terminal of the fourth transistor is coupled to a contro_bar voltage bar ($V_{ctrl\_bar}$), a drain terminal of the third transistor is coupled to the output port ($V_o^+$), and a drain terminal of the fourth transistor is coupled to the output port ($V_o^-$); and a fifth and a sixth transistors, each having source terminals coupled to a drain terminal of a second transistor, a gate terminal of the fifth transistor is coupled to a control_bar voltage ($V_{ctrl\_bar}$), a gate terminal of the sixth transistor is coupled to a control voltage ($V_{ctrl}$), a drain terminal of the fifth transistor is coupled to the output port ($V_o^+$), and a drain terminal of the sixth transistor is coupled to the output port ($V_o^-$).

In one embodiment, the amplifier further includes a controller to generate a control voltage ($V_{ctrl}$) to control a phase switching of either the I or Q phase switching gain stage.

In one embodiment, the I or Q phase switching gain stage includes a variable resistance coupled between output ports ($V_o^+$, $V_o^-$) of the I or Q phase switching gain stage to tune a gain of the I or Q phase switching gain stage, a first inductance between output port $V_o^+$ and a supply voltage terminal to tune an operating frequency of the I or Q phase switching gain stage, and a second inductance between output port $V_o^-$ and the supply voltage terminal to tune an operating frequency of the I or Q phase switching gain stage.

According to a second aspect, receive in-phase quadrature (IQ) amplifier includes an in-phase (I) phase switching gain stage to receive an I component of an input signal and to generate an amplified phase switching I signal. The amplifier includes a quadrature (Q) phase switching gain stage to receive a Q component of the input signal and to generate an amplified phase switching Q signal. The amplifier includes an in-phase quadrature (IQ) poly-phase filter coupled to the I and Q phase switching gain stages to receive the amplified phase switching I and Q signals and outputs a balanced signal. The amplifier includes a common gain stage coupled to the IQ poly-phase filter to receive the balanced signal from the IQ poly-phase filter and outputs an amplified balanced signal.

In one embodiment, the I or Q phase switching gain stage comprises a passive phase switching component or an active phase switching component. In one embodiment, the I or Q phase switching gain stage includes a double-pole double-throw switch to receive either the I or Q components of the input signal and to generate a phase switching I or Q signal, and a trans-conductance amplifier coupled to the doubled-pole double-throw switch to receive the phase switching I or Q signal from the doubled-pole double-throw switch and outputs the amplified phase switching I or Q signal.

In one embodiment, the double-pole double-throw switch comprises two fully-differential single-pole single-throw switches. In one embodiment, the I or Q phase switching gain stage comprises a cascode selector amplifier.

In one embodiment, the cascode selector amplifier includes a trans-conductance stage to receive a balanced input signal ($V_i^+$, $V_i^-$) and generates an amplified signal; an active switching circuit coupled to the trans-conductance stage to receive the amplified signal from the trans-conductance stage and outputs a balanced phase switching signal at output ports ($V_o^+$, $V_o^-$); and a biasing circuit coupled to the trans-conductance stage to provide a variable bias signal to the trans-conductance stage.

In one embodiment, the trans-conductance stage comprises a first and a second transistors, each having source terminals coupled to a common node that is coupled to the biasing circuit, gate terminals to receive a corresponding component of the balanced input signal ($V_i^+$, $V_i^-$, and drain terminals coupled to the active switching circuit.

In one embodiment, the active switching circuit includes a third and a fourth transistors, each having source terminals coupled to a drain terminal of a first transistor, a gate terminal of the third transistor is coupled to a control voltage ($V_{ctrl}$), a gate terminal of the fourth transistor is coupled to a control_bar voltage bar ($V_{ctrl\_bar}$) a drain terminal of the third transistor is coupled to the output port ($V_o^+$), and a drain terminal of the fourth transistor is coupled to the output port ($V_o^-$); and a fifth and a sixth transistors, each having source terminals coupled to a drain terminal of a second transistor, a gate terminal of the fifth transistor is coupled to a control_bar voltage ($V_{ctrl\_bar}$), a gate terminal of the sixth transistor is coupled to a control voltage ($V_{ctrl}$), a drain terminal of the fifth transistor is coupled to the output port ($V_o^+$), and a drain terminal of the sixth transistor is coupled to the output port ($V_o^-$).

According to a third aspect, a receive in-phase quadrature (IQ) amplifier includes an in-phase (I) phase switching gain stage to receive a balanced input signal and to generate an amplified phase switching I signal at ports ($V_I^+$, $V_I^-$); a quadrature (Q) phase switching gain stage to receive the balanced input signal and to generate an amplified phase switching Q signal at ports ($V_Q^+$, $V_Q^-$); and an in-phase quadrature (IQ) poly-phase filter coupled to the I and Q phase switching gain stages to receive the phase switching I and Q signals and to output a balanced signal ($V_O^+$, $V_O^-$).

In one embodiment, the I phase switching gain stage includes a first trans-conductance stage, comprising a first and a second transistors, each having source terminals coupled to a first common node, gate terminals to receive a corresponding component of the balanced input signal ($V_i^+$, $V_i^-$); and a first active switching circuit coupled to the first trans-conductance stage, the first active switching circuit includes a third and a fourth transistors, each having source terminals coupled to a drain terminal of the first transistor, a gate terminal of the third transistor is coupled to an I control voltage ($V_{CI}$), a gate terminal of the fourth transistor is coupled to an I control_bar voltage ($V_{CI\_bar}$), a drain terminal of the third transistor is coupled to port ($V_I^+$), and a drain terminal of the fourth transistor is coupled to port ($V_I^-$); and a fifth and a sixth transistors, each having source terminals coupled to a drain terminal of the second transistor, a gate terminal of the fifth transistor is coupled to the I control_bar voltage ($V_{CI\_bar}$), a gate terminal of the sixth transistor is coupled to the I control voltage ($V_{CI}$), a drain terminal of the fifth transistor is coupled to the port ($V_I^+$), and a drain terminal of the sixth transistor is coupled to the port ($V_I^-$).

In one embodiment, the Q phase switching gain stage includes a second trans-conductance stage, comprising a seventh and an eight transistors, each having source terminals coupled to a second common node, gate terminals to receive a corresponding component of the balanced input signal ($V_i^+$, $V_i^-$), and a second active switching circuit coupled to the second trans-conductance stage. The second active switching circuit includes a ninth and a tenth transistors, each having source terminals coupled to a drain terminal of the seventh transistor, a gate terminal of the ninth transistor is coupled to a Q control voltage ($V_{CQ}$), a gate terminal of the tenth transistor is coupled to a Q control_bar voltage ($V_{CQ\_bar}$), a drain terminal of the ninth transistor is coupled to the port ($V_Q^+$), and a drain terminal of the tenth transistor is coupled to the port ($V_Q^-$); and an eleventh and a twelfth transistors, each having source terminals coupled to a drain terminal of the eighth transistor, a gate terminal of the eleventh transistor is coupled to a Q control_bar voltage ($V_{CQ\_bar}$), a gate terminal of the twelfth transistor is coupled to a Q control voltage ($V_{CQ}$), a drain terminal of the eleventh transistor is coupled to the port ($V_Q^+$), and a drain terminal of the twelfth transistor is coupled to the port ($V_Q^-$).

According to a fourth aspect, a transmit in-phase quadrature (IQ) amplifier includes a trans-conductance stage to receive a balanced input signal ($V_i^+$, $V_i^-$) and to output an amplified signal, an in-phase quadrature (IQ) poly-phase filter coupled to the trans-conductance stage to receive the amplified signal and to generate a four-phase signal, an in-phase (I) phase switching stage coupled to the IQ poly-phase filter to receive an I component of the four-phase signal and to generate a phase switching I signal at output ports ($V_I^+$, $V_I^-$), and a quadrature (Q) phase switching stage coupled to the IQ poly-phase filter to receive a Q component of the four-phase signal and to generate a phase switching Q signal at output ports ($V_Q^+$, $V_Q^-$).

In one embodiment, the trans-conductance stage includes a first and a second transistors, each having source terminals coupled to a common node, gate terminals to receive the corresponding component of the balanced input signal ($V_i^+$, $V_i^-$). The I phase switching stage includes a third and a fourth transistors, each having source terminals to receive I+ component of the four-phase signal, a gate terminal of the third transistor is coupled to an I control voltage ($V_{CI}$), a gate terminal of the fourth transistor is coupled to an I control_bar voltage ($V_{CI\_bar}$), a drain terminal of the third transistor is coupled to the output port ($V_I^+$), and a drain terminal of the fourth transistor is coupled to the output port ($V_I^-$); and a fifth and a sixth transistors, each having source terminals coupled to receive I− component of the four-phase signal, a gate terminal of the fifth transistor is coupled to the I control_bar voltage ($V_{CI\_bar}$), a gate terminal of the sixth transistor is coupled to the I control voltage ($V_{CI}$), a drain terminal of the fifth transistor is coupled to the output port ($V_I^+$), and a drain terminal of the sixth transistor is coupled to the output port ($V_I^-$). The Q phase switching stage includes a seventh and a eighth transistors, each having source terminals to receive Q+ component of the four-phase signal, a gate terminal of the seventh transistor is coupled to a Q control voltage ($V_{CQ}$), a gate terminal of the eighth transistor is coupled to a Q control_bar voltage ($V_{CQ\_bar}$), a drain terminal of the seventh transistor is coupled to the output port ($V_Q^+$), and a drain terminal of the eighth transistor is coupled to the output port ($V_Q^-$); and an ninth and a tenth transistors, each having source terminals to receive Q− component of the four-phase signal, a gate terminal of the ninth transistor is coupled to a Q control_bar voltage ($V_{CQ\_bar}$), a gate bar terminal of the tenth transistor is coupled to a Q control voltage ($V_{CQ}$), a drain terminal of the ninth transistor is coupled to the output port ($V_Q^+$), and a drain terminal of the tenth transistor is coupled to the output port ($V_Q^-$).

FIG. 1 is a block diagram illustrating an example of a wireless communication device according one embodiment of the invention. Referring to FIG. 1, wireless communication device 100, also simply referred to as a wireless device, includes, amongst others, an RF frontend module 101 and a baseband processor 102. Wireless device 100 can be any kind of wireless communication devices such as, for example, mobile phones, laptops, tablets, network appliance devices (e.g., Internet of thing or IOT appliance devices), etc.

In a radio receiver circuit, the RF frontend is a generic term for all the circuitry between the antenna up to and including the mixer stage. It consists of all the components in the receiver that process the signal at the original incoming radio frequency, before it is converted to a lower frequency, e.g., IF. In microwave and satellite receivers it is often called the low-noise block (LNB) or low-noise downconverter (LND) and is often located at the antenna, so that the signal from the antenna can be transferred to the rest of the receiver at the more easily handled intermediate frequency. A baseband processor is a device (a chip or part of a chip) in a network interface that manages all the baseband processing functions to process baseband signals.

In a radio transmitter circuit, the RF frontend is a generic term for all the circuitry between the mixer stage up to and including the antenna. It consists of all the components in the transmitter that processes the signal at the more easily handled intermediate frequency, IF, before it is converted to a radio frequency, e.g., RF, for transmission. In microwave and satellite transmitters it is often called the block upconverter (BUC), which makes up the "transmit" side of the system, and is often used in conjunction with an LNB, which makes up the "receive" side of the system.

In one embodiment, RF frontend module 101 includes one or more RF transceivers, where each of the RF transceivers transmits and receives RF signals within a particular frequency band (e.g., a particular range of frequencies such as non-overlapped frequency ranges) via one of a number of RF antennas. The RF frontend IC chip further includes an IQ generator and/or a frequency synthesizer coupled to the RF transceivers. The IQ generator or generation circuit generates and provides an LO signal to each of the RF transceivers to enable the RF transceiver to mix, modulate, and/or demodulate RF signals within a corresponding frequency band. The RF transceiver(s) and the IQ generation circuit may be integrated within a single IC chip as a single RF frontend IC chip or package.

Figure 2:
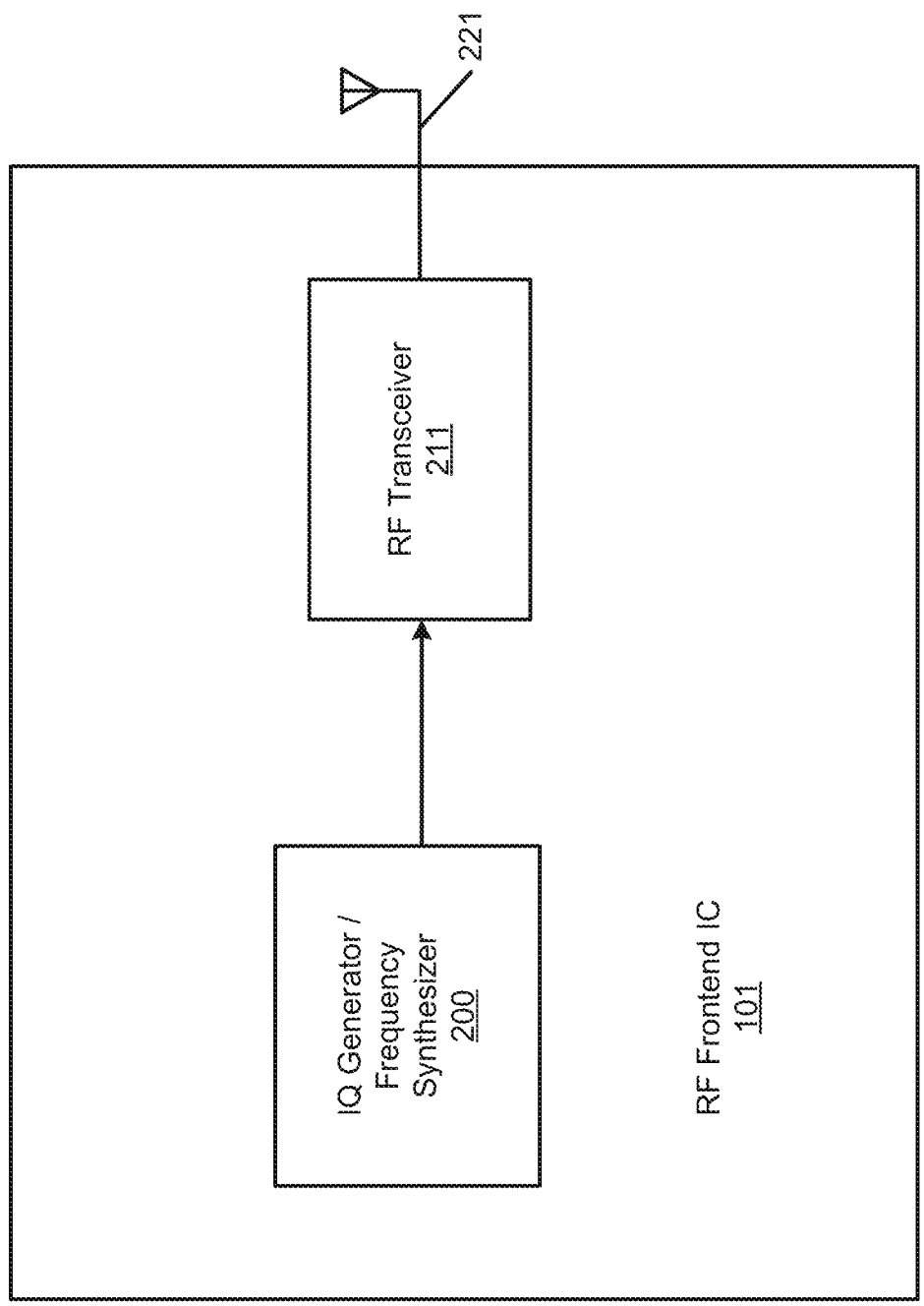
FIG. 2 is a block diagram illustrating an example of an RF frontend integrated circuit according to one embodiment.

FIG. 2 is a block diagram illustrating an example of an RF frontend integrated circuit according to one embodiment of the invention. Referring to FIG. 2, RF frontend 101 includes, amongst others, an IQ generator and/or frequency synthesizer 200 coupled to a RF transceiver 211. Transceiver 211 is configured to transmit and receive RF signals within one or more frequency bands or a broad range of RF frequencies via RF antenna 221. In one embodiment, transceiver 211 is configured to receive one or more LO signals from frequency synthesizer 200. The LO signals are generated for the one or more corresponding frequency bands. The LO signals are utilized to mix, modulate, demodulated by the transceiver for the purpose of transmitting and receiving RF signals within corresponding frequency bands. Although there is only one transceiver and antenna shown, multiple pairs of transceivers and antennas can be implemented, one for each frequency bands.

Figure 3:
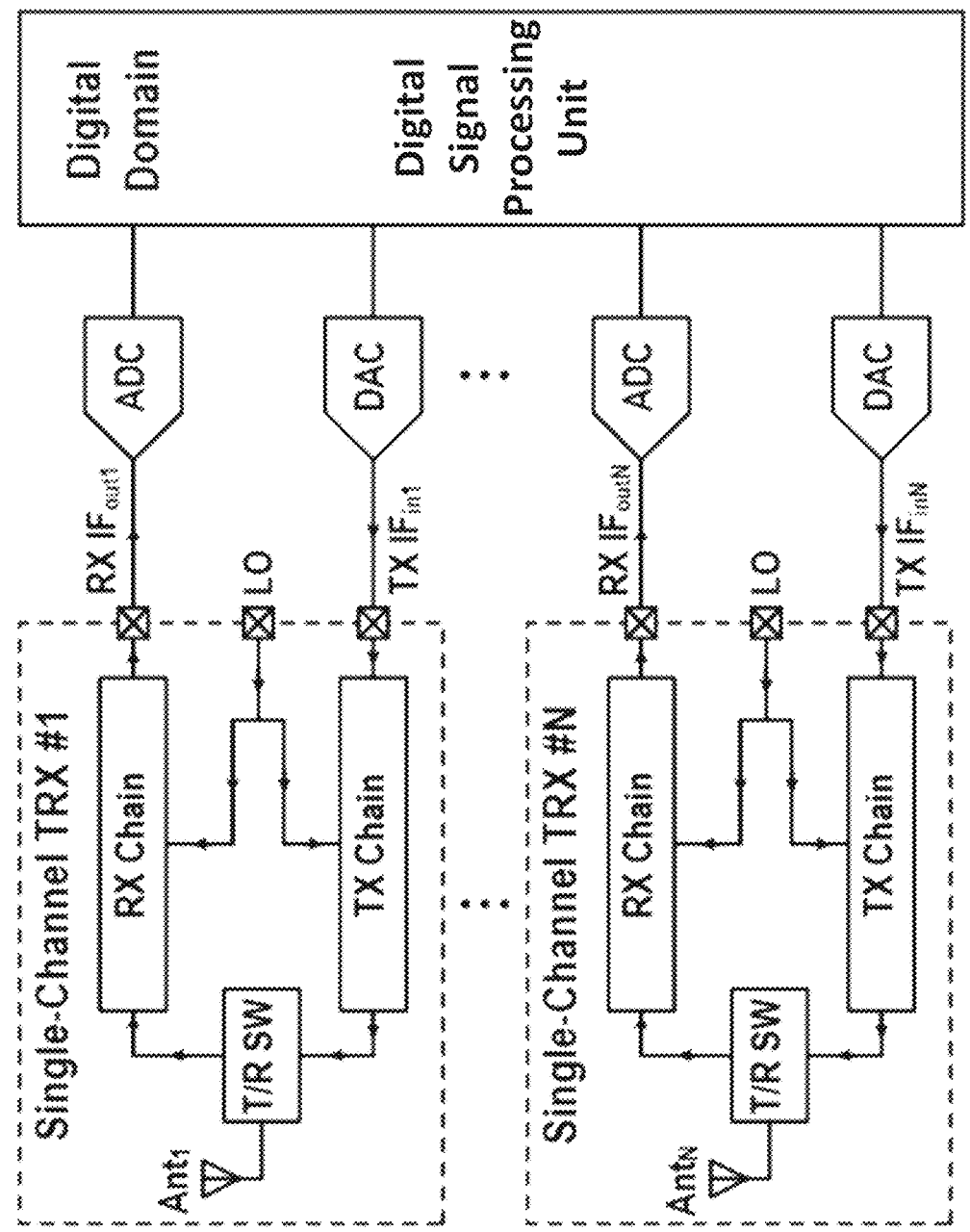
FIG. 3 is a block diagram illustrating an example of a transceiver according to one embodiment.

FIG. 3 is a block diagram illustrating an example of a transceiver according to one embodiment. Transceiver 300 may represent RF transceiver 211 of FIG. 2. Referring to FIG. 3, transceiver 300 includes a number of single-channel transceivers (e.g., single-channel TRX #1 . . . single-channel TRX #N), analog-digital converters (ADCs), digital-analog converters (DACs), and a digital signal processing unit. The digital signal processing unit can process digital signals in a digital domain. The single-channel transceivers each can include an up-conversion TX chain, a down-conversion RX chain, a T/R switch, and an antenna. The single-channel transceivers can each receive/transmit a respective analog stream simultaneously from/to one or more remote devices (e.g., a cellular mobile device, user equipment, and/or a cellular mobile device site) independent of the rest of the single-channel transceivers. Each of the ADCs can convert an analog signal to a digital signal. Each of the DACs can convert a digital signal to an analog signal. As shown, pairs of ADCs and DACs are coupled to each one of the single-channel transceivers to convert data streams from/to an analog domain to/from the digital domain. In one embodiment, the DSP unit is configured to generate a first set of digital data streams simultaneously and each of the first set of digital data streams is converted by a respective one of the DACs into an analog data stream to be transmitted to a remote device by a respective one of the single-channel transceiver.

In one embodiment, the single-channel transceivers, e.g., single-channel TRX #1 . . . single-channel TRX #N, have identical channels. In one embodiment, the RF frontend circuit is part of a cellular handheld user mobile device. In another embodiment, the RF frontend circuit is part of a cellular mobile device site which can stream data to one or more cellular handheld user mobile devices. In another embodiment, the identical channels can stream data to one or more cellular handheld user mobile devices by transmitting and receiving a respective independent data streams.

In one embodiment, the single-channel transceivers each can include an antenna which can include a directional antenna. The directional antenna of each of the single-channel transceivers can correspond to a different radiation angle or a similar radiation angle in comparison with the other directional antennas of the RF frontend. For example, different radiation angles can track a user moving within many corresponding radiation angles while similar radiation angles can track two or more users moving within a corresponding radiation angle or similar radiation angles.

In one embodiment, the DSP unit is further configured to receive a second set of digital data streams from the ADCs. In one embodiment, each of the second set of digital data streams is received by a respective one of the single-channel transceiver via a specific radiation angle. In one embodiment, the second set of digital data streams can be received simultaneously. In one embodiment, the second set of digital data streams are synchronized in time. In one embodiment, the first set of digital streams are synchronized in time.

Figure 4:
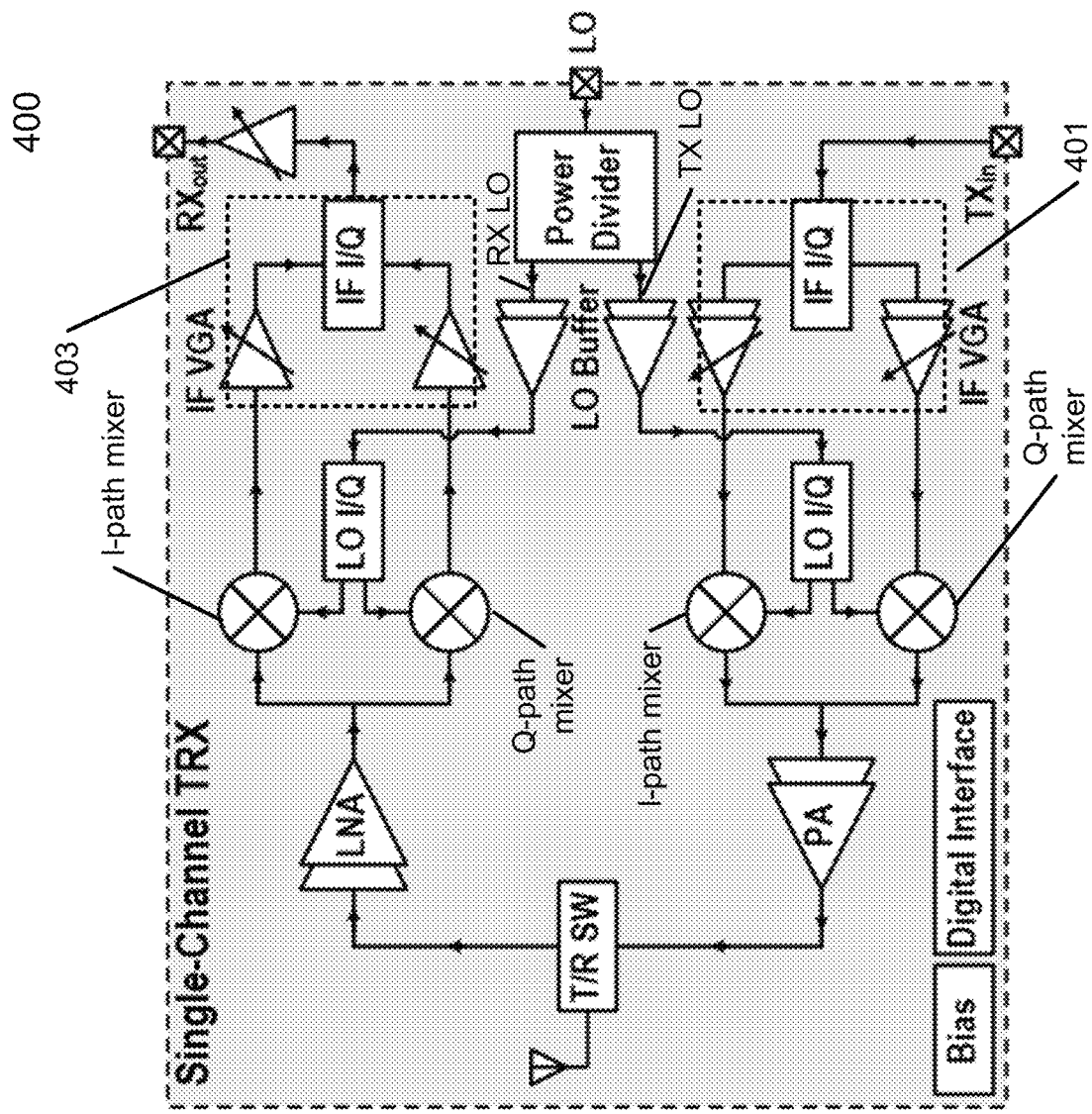
FIG. 4 is a block diagram illustrating an example of a single-channel transceiver circuit according to one embodiment.

FIG. 4 is a block diagram illustrating an example of a single-channel transceiver circuit according to one embodiment. Referring to FIG. 4, single-channel transceiver 400 may represent single-channel TRX #1 of FIG. 3. Transceiver 400 is configured to transmit/receive RF signals for a single-channel. The single-channel can be a single frequency channel. In one embodiment, in the TX chain, transceiver 400 can include a power amplifier (PA), in-phase/quadrature (I/Q) up-conversion mixer(s), a local oscillator (LO) buffer, a LO I/Q generation network, IF variable-gain amplifiers (VGAs), and an IF I/Q generation network. The TX chain can include two paths, 1) I path for processing in-phase component signals and 2) Q-path for processing quadrature component signals. In one embodiment, IF I/Q quadrature network can generate a I component signal and a Q component signal based on an intermediate signal to be transmitted (e.g., TXin signal). The I and Q component signals can be further amplified by IF VGA. Up-conversion mixers for each of the I-path and the Q-path receives the amplified I and Q component signals and the LO I/Q signals (generated by the LO I/Q generation network based on an TX LO signal) and mixes/modulates the IF I/Q-path component signals to a higher frequency band. The higher frequency I and Q component signals are then recombined and amplified by the PA before being transmitted to the antenna via a T/R switch to be radiated by the antenna.

In one embodiment, for the RX chain, transceiver 400 can include a low-noise amplifier (LNA), I/Q down-conversion mixer(s), a LO buffer, an LO I/Q quadrature generation network, an IF I/Q quadrature generation network, and IF VGAs. The TX chain and RX chain can be coupled by a T/R switch, which is coupled to the antenna. Similar to the TX chain, the RX chain can include two paths, 1) I path for processing in-phase component signals and 2) Q-path for processing quadrature component signals. In one embodiment, the RX chain receives an RF signal, via the antenna, from a remote device and the RF signal is amplified by the LNA (which may or may not include a band pass filter). The I-path down-convert mixer and the Q-path down-convert mixer mixes/demodulates the RF signal into I-path signals and Q-path signals using the LO I/Q components (e.g., generated by LO I/Q generation network based on an RX LO signal). The I-path and Q-path signals can be further amplified by I-path and Q-path IF VGAs. The IF I/Q quadrature generation network can then generate an RXout signal based on the amplified I-path and Q-path signals. In one embodiment, the RXout signal may be further amplified by additional amplifiers or VGAs.

In one embodiment, the TX LO and RX LO signals are generated by an on-chip LO power divider using an LO signal. The LO signal may be provided by a crystal oscillator. In one embodiment, the TX LO and RX LO signals are buffered by LO buffers. In one embodiment, the single-channel TRX includes a bias interface which can provide bias voltage/current sources for the single-channel TRX. In another embodiment, a pair of ADC and DAC are integrated with the single-channel TRX and the single-channel TRX can include a digital interface to interface with the digital domain of a digital signal processing unit (such as the digital signal processing unit of FIG. 3).

In some embodiments, transceiver 400 has a dual-band continuous-time image rejection for frequency range 24.5-43 GHz using phase switching techniques. For example, LO generations provide LO signal in the frequency ranges 29.5 GHz-35.5 GHz and/or 32-37 GHz. As discussed above, by fixing the IF frequency at 7.5 GHz, low-side LO injection (freq_LO=freq_RF−freq_IF) for the 37-43 GHz band is realized when LO frequency ranges between 29.5 GHz and 35.5 GHz. High-side LO injection (freq_LO=freq_RF+freq_IF) for the 24.5-29.5 GHz band is realized when LO frequency ranges between 32 and 37 GHz. For the low-side LO injection case, the differential IQ components of the up/down converted IF signal have to be in-phase to retrieve the original received/transmitted signal. For the high-side LO injection, either the I- or Q-component of the up/down converted IF signal should be 180 degrees out-of-phase to retrieve the original received/transmitted signal. In some embodiments, either the I- or Q-component of the up/down converted IF signal is phase switched to obtain the 180 degrees out-of-phase signal for the high-side LO injection, as further described by embodiments of FIGS. 7-14.

Figure 7A:
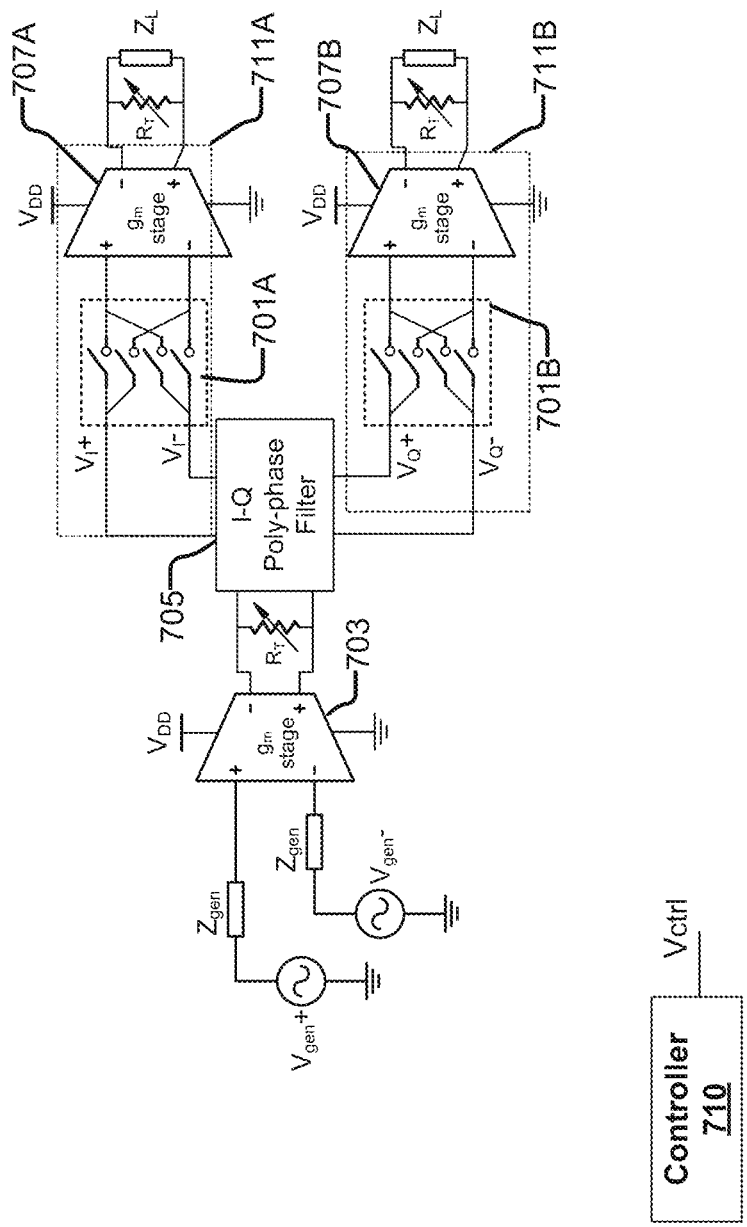
FIG. 7A illustrates a block diagram of a passive phase switching transmit IQ amplifier and FIG. 7B illustrates a block diagram of a passive switching network according to one embodiment.
Figure 7B:
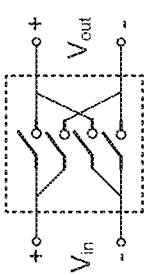
Figure 7B:
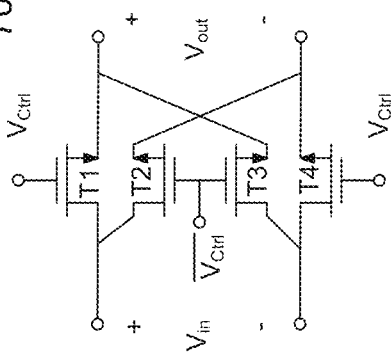

FIG. 7A illustrates a phase switching transmit IQ amplifier 700 and FIG. 7B illustrates a passive switching network 701 according to one embodiment. Amplifier 700 can represent IF I/Q quadrature network and IF VGAs (shown in block 401) in the transmit (Tx) IQ signal chain of FIG. 4. In one embodiment, amplifier 700 represents the transmit IQ amplifier 500 of FIG. 5A with the addition of the passive switching networks (701A-B) (further shown in FIG. 7B) at the I and Q signal paths after the IQ poly-phase filter, e.g., between the IQ poly-phase filter and the corresponding I and/or Q trans-conductance ($g_m$) stages.

In one embodiment, amplifier 700 includes a $g_m$ stage 703 that is common to both I and Q signal paths. $g_m$ stage 703 receives a balanced (differential) input signal and amplifies the input signal by $g_m * R_T$. Example of a $g_m$ stage is shown in block 903 of FIG. 9 with output ports of the $g_m$ stage coupled to a variable resistance $R_T$ for gain tuning. $g_m$ stage 703 is coupled to IQ poly-phase filter 705 to provide the amplified signal to filter 705. Filter 705 then generates a four phase signal ($I^+$, $Q^+$, $I^-$, and $Q^-$), e.g., the I and Q signals, using the amplified signal.

For the I signal path, I phase switching gain stage 711A receives the in-phase (I) signal and outputs an amplified phase switching I signal. For the Q signal path, Q phase switching gain stage 711B receives the Q signal and outputs an amplified phase switching Q signal.

In one embodiment, I phase switching gain stage 711A includes passive switching network 701A and $g_m$ stage 707A coupled in a series connection. In one embodiment, Q phase switching gain stage 711B includes passive switching network 701B and $g_m$ stage 707B coupled in a series connection.

In one embodiment, each of the passive switching networks 701A-B includes a double-pole double throw switch (DPDT). A DPDT switch operates in 1 of 2 modes. When the DPDT switch operates in mode 1, the positive terminal of the $g_m$ stage receives $V_{I/Q}^+$ and the negative terminal of the $g_m$ stage receives $V_{I/Q}^-$. When the DPDT switch operates in mode 2, the positive terminal of the $g_m$ stage receives $V_{I/Q}^-$ and the negative terminal of the $g_m$ stage receives $V_{I/Q}^+$. That is, the differential signal ($V_{I/Q}^+$, $V_{I/Q}^-$) is phase switched either 0 (e.g., non-inverted) or 180 degrees out of phase (e.g., inverted). A DPDT has six terminals, where two of the six terminals are independent input terminals and four terminals are output terminals. In one embodiment, a DPDT includes two fully-differential single-pole single-throw (SPST) switches. A first SPST is used for phase switching for the I signal. A second SPST is used for phase switching for the Q signal. In one embodiment, the DPDT or fully-differential SPST are implemented as CMOS switches.

Referring to FIG. 7B, passive switching network 701 can represent network 701A or 701B of FIG. 7A. In one embodiment, passive switching network 701 receives either ($V_I^+$, $V_I^-$) for network 701A or ($V_Q^+$, $V_Q^-$) for network 701B, at input port ($V_{in}^+$, $V_{in}^-$) and outputs phase switching signals at output port ($V_{out}^+$, $V_{out}^-$). In one embodiment, passive switching network 701 includes transistors (T1-T4). The drain terminals of T1 and T2 are coupled to port $V_{in}^+$. The drain terminals of T3 and T4 are coupled to port $V_{in}^-$. The gate terminals of T1 and T4 are coupled to $V_{ctrl}$ and the gate terminals of T2 and T3 are coupled to $V_{ctrl\_bar}$. The source terminals of T1 and T3 are coupled to port $V_{out}^+$ and the source terminals of T2 and T4 are coupled to port $V_{out}^-$. Asserting $V_{ctrl}$="1" causes signal at port ($V_{out}^+$, $V_{out}^-$) to be ($V_{in}^+$, $V_{in}^-$) with 0-degree phase shift (e.g., non-inverted). Asserting $V_{ctrl}$="0" causes signal at ports ($V_{out}^+$, $V_{out}^-$) to be ($V_{in}^-$, $V_{in}^+$), e.g., with 180-degree phase shift (inverted).

In one embodiment, passive switching network 701A is caused to phase switch while passive switching network 701B remains inactive (e.g., the $V_{ctrl}$ connection to network 701B is open circuit). In another embodiment, passive switching network 701B is caused to phase switch while passive switching network 701A remains inactive (e.g., the $V_{ctrl}$ connection to network 701A is open circuit). In another embodiment, either passive switching network 701A or passive switching network B are in the I or Q signal path, but not both. Although only one of the passive switching networks 701A-B is utilized to cause I or Q signal inversion, having both passive switching networks 701A-B in the signal path allows output signals at the load impedances $Z_L$ of corresponding I and Q signal paths to be balanced, e.g., load impedances $Z_L$ at I and Q signal paths observe a same signal attenuation by the passive switching networks 701A-B. Since there is signal loss due to the passive switching, thus, the total gain of the amplifier is expected to attenuation.

In one embodiment, passive switching networks 701A-B are caused to operate in modes 1 or 2 by a control voltage $V_{ctrl}$ provided by a controller 710. Controller 710 can be implemented by a circuit to detect when there is high-side LO injection. As described above, for the high-side LO injection, either the I- or Q-component of the up/down converted IF signal is phase switched to obtain the 180 degrees out-of-phase signal to retrieve the original received/transmitted signal. In one embodiment, controller 710 is a comparison circuit that detects when LO frequency is higher than RF signal (e.g., high-side LO injection). When it is determined that LO frequency is higher than the RF signal, controller 710 provides $V_{ctrl}$ to cause either the I or Q signal to be inverted (e.g., phase switched).

Figure 8A:
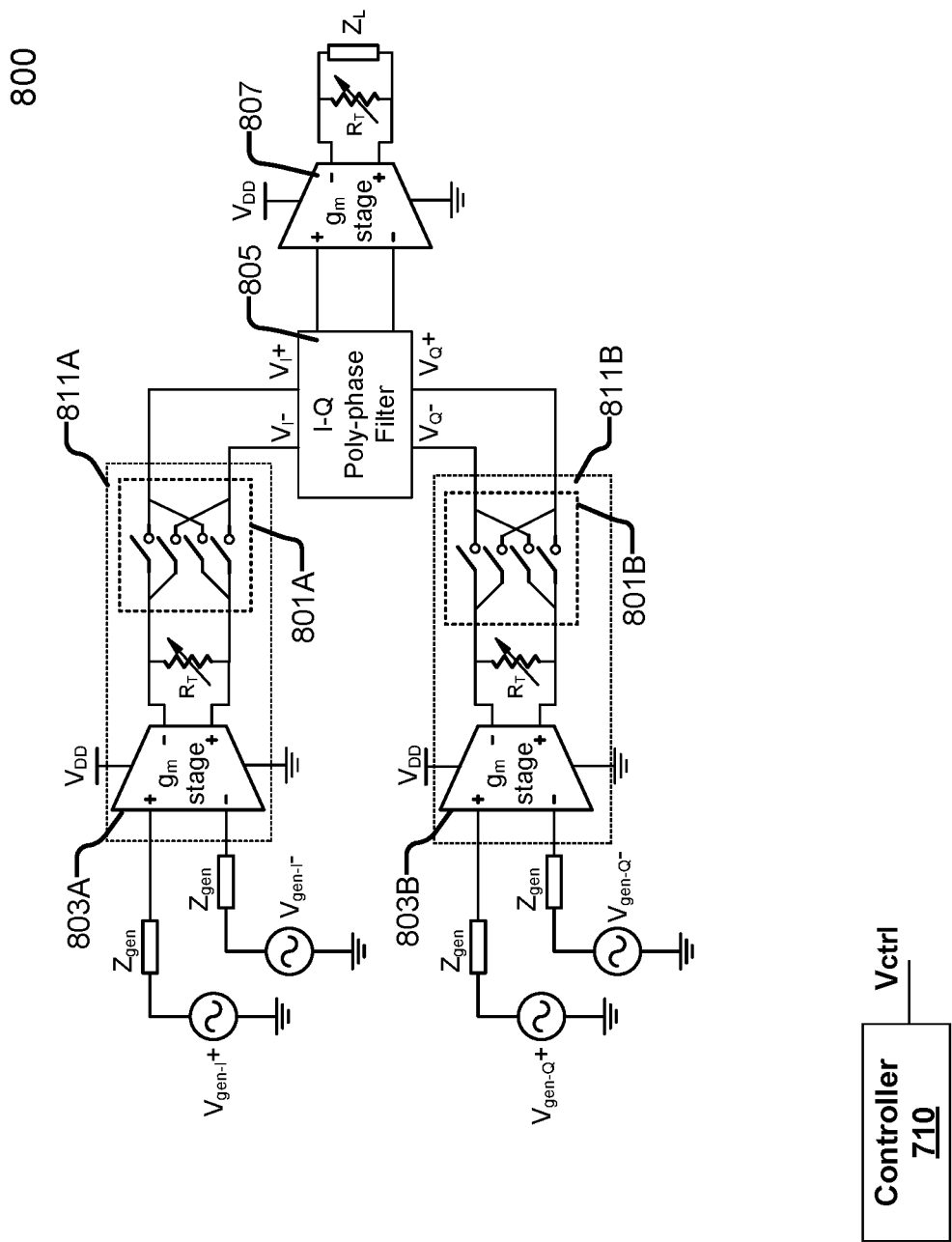
FIG. 8A illustrates a block diagram of a passive phase switching receive IQ amplifier and FIG. 8B illustrates a block diagram of a passive switching network according to one embodiment.
Figure 8B:
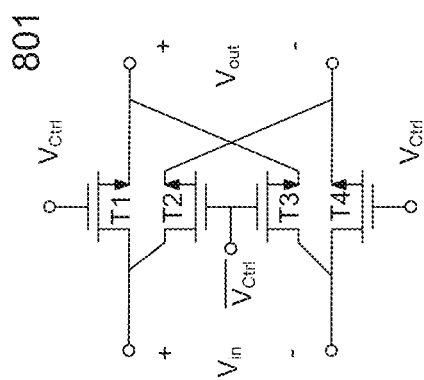
Figure 8B:
Figure 8B:
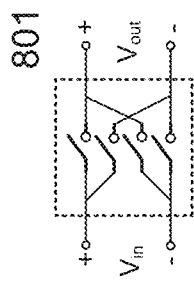

FIG. 8A illustrates a phase switching receive IQ amplifier 800 and FIG. 8B illustrates a passive switching network 801 according to one embodiment. Amplifier 800 can represent IF I/Q quadrature network and the IF VGAs (shown in block 403) in the receive (Tx) IQ signal chain of FIG. 4. In one embodiment, amplifier 800 represents the receive IQ amplifier 600 of FIG. 6 with the addition of passive switching networks (801A-B) (further shown in FIG. 8B) coupled to the I and Q signal paths before the IQ poly-phase filter, e.g., between corresponding I and/or Q $g_m$ stages and the IQ poly-phase filter.

In one embodiment, for the I signal path, I phase switching gain stage 811A receives an input signal (e.g., signal from output of I-path mixer) and outputs an amplified phase switching I signal ($I^+$, $I^-$). For the Q signal path, Q phase switching gain stage 811B receives an input signal ((e.g., signal from output of Q-path mixer)) and outputs an amplified phase switching Q signal ($Q^+$, $Q^-$). I phase switching gain stage 811A can include a $g_m$ stage 803A coupled to a passive switching network 801A in series connection. Q phase switching gain stage 811B can include a $g_m$ stage 803B coupled to a passive switching network 801B in series connection.

In one embodiment, I phase switching gain stage 811A and Q phase switching gain stage 811B are coupled to IQ poly-phase filter 805 to provide the amplified I and/or Q phase switching signal to filter 805 and IQ poly-phase filter 805 combines the I and Q signals ($I^+$, $Q^+$, $I^-$, and $Q^-$) into a balanced signal. Amplifier 800 includes a $g_m$ stage 807 coupled to IQ poly-phase filter 805 to receive the balanced signal and to generate an amplified balanced signal. The $g_m$ stage 807 is common to both the I and Q signal paths and amplifies the signal by $g_m * R^T$.

In one embodiment, each of the passive switching networks 801A-B includes a DPDT. In one embodiment, each of the DPDTs include two fully-differential SPST. In one embodiment, passive switching networks 801A-B are caused to operate in modes 1 or 2 by a control voltage $V_{ctrl}$ provided by a controller 710.

Referring to FIG. 8B, passive switching network 801 can represent network 801A or 801B of FIG. 8A and can be implemented similar to passive switching network 701 of FIG. 7B. In one embodiment, passive switching network 801 receives either the I signal or the Q signal at balanced input port ($V_{in}^+$, $V_{in}^-$) and outputs phase switching signals at output port ($V_{out}^+$, $V_{out}^-$). In one embodiment, network 801 includes transistors (T1-T4). The drain terminals of T1 and T2 are coupled to port $V_{in}^+$. The drain terminals of T3 and T4 are coupled to port $V_{in}^-$. The gate terminals of T1 and T4 are coupled to Vail and the gate terminals of T2 and T3 are coupled to $V_{ctrl\_bar}$. The source terminals of T1 and T3 are coupled to port $V_{out}^+$ and the source terminals of T2 and T4 are coupled to port $V_{out}^-$. Asserting $V_{ctrl}$="1" causes signal at ports ($V_{out}^+$, $V_{out}^-$) to be ($V_{in}^+$, $V_{in}^-$) with 0-degree phase shift (e.g., non-inverted). Asserting $V_{ctrl}$="0" causes signal at ports ($V_{out}^+$, $V_{out}^-$) to be ($V_{in}^-$, $V_{in}^+$), e.g., with 180-degree phase shift (inverted).

Instead of a passive switching network, embodiments of the amplifiers can be implemented with active switching networks that is a co-design of phase switching and a cascode amplifier (e.g., active switching within the $g_m$ stage).

Figure 9:
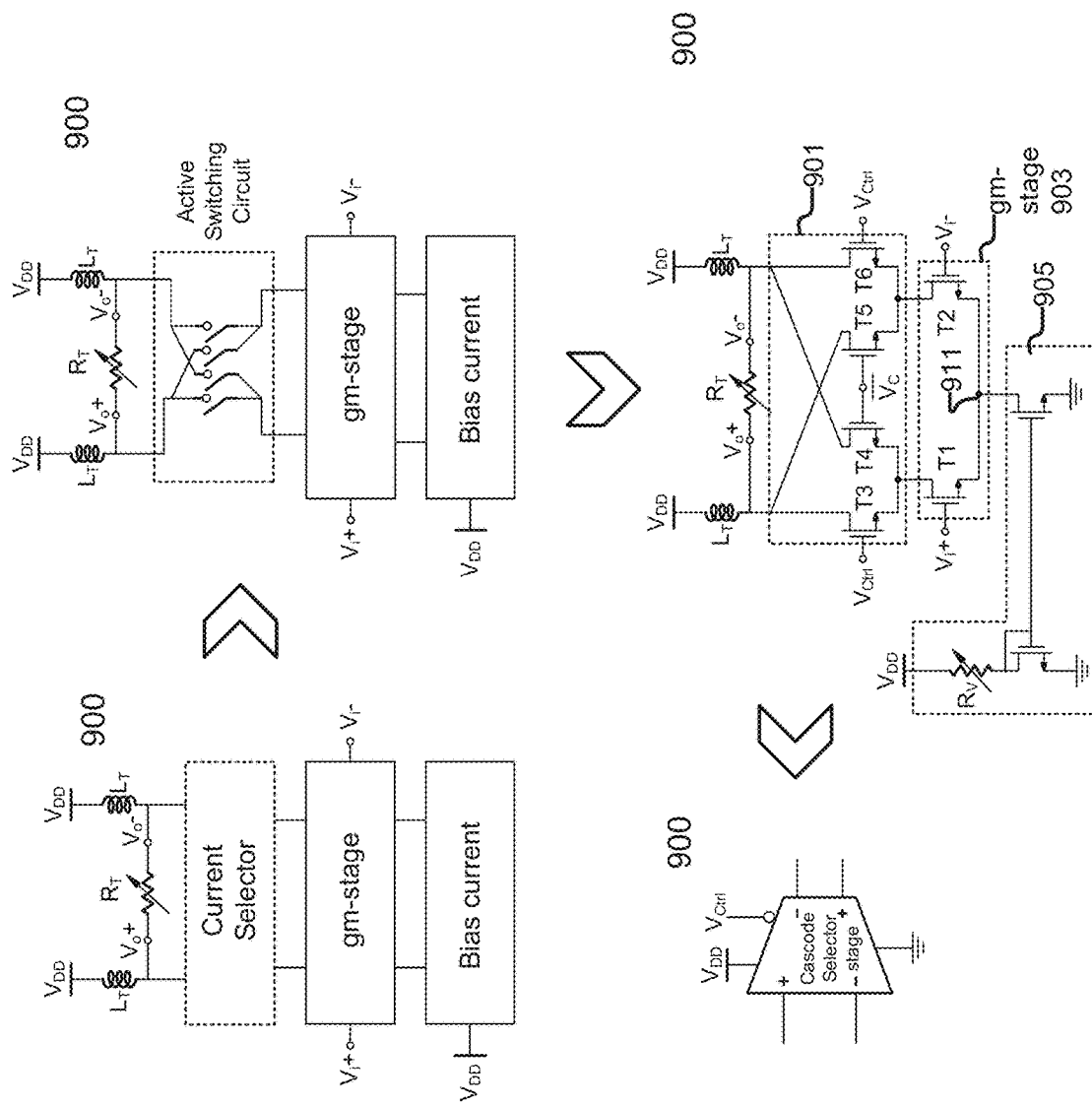
FIG. 9 illustrates a block diagram of a cascode current selector amplifier according to one embodiment.

FIG. 9 discloses a CMOS implementation of a current-selector cascode amplifier (or cascode selector stage) 900. The current selector cascode amplifier 900 includes an active switching circuit 901 cascoded to a $g_m$ stage 903. For example, $g_m$ stage 903 includes transistors T1 and T2, each having source (S) terminals coupled to a common node 911 that is coupled to a biasing circuit 905, gate (G) terminals to receive a corresponding component of the balanced input signal ($V_i^+$, $V_i^-$), and drain (D) terminals coupled to active switching circuit 901.

Active switching circuit 901 includes transistors T3 and T4, each having source terminals coupled to D terminal of transistor T1, G terminal of transistor T3 is coupled to a control voltage ($V_{ctrl}$), G terminal of transistor T4 is coupled to a control_bar voltage ($V_{ctrl\_bar}$), D terminal of transistor T3 is coupled to output port ($V_o^+$), and D terminal of transistor T4 is coupled to output port ($V_o^-$). Active switching circuit 901 includes transistors T5 and T6, each having S terminals coupled to D terminal of transistor T2, G terminal of transistor T5 is coupled to the control_bar voltage ($V_{ctrl\_bar}$), G terminal of transistor T6 is coupled to the control voltage ($V_{ctrl}$), D terminal of transistor T5 is coupled to output port ($V_o^+$), and D terminal of transistor T6 is coupled to output port ($V_o^-$).

Referring to FIG. 9, $V_i$ denotes the input signal (i.e., differential I or Q signal), $V_{ctrl}$ denotes the control signal that controls the phase switching (selects the current flow), and $V_{ctrl\_bar}$ denotes the complementary signal of $V_{ctrl}$. E.g., when $V_{ctrl}$=1, $V_{ctrl\_bar}$=0, and when $V_{ctrl}$=0, $V_{ctrl\_bar}$=1. $V_{ctrl}$ can be switched to invert the phase of a signal passing through active switching network. For example, when $V_{ctrl}$="1", output signal $V_o$ is an amplified signal of $V_i$ with 0-degree phase shift (e.g., non-inverted). When $V_{ctrl}$="0", output signal $V_o$ is an amplified signal of $V_i$ with 180-degree phase shift (e.g., inverted). Thus, the configuration of amplifier 900 enables active switching of the differential input signal ($V_i^+$, $V_i^-$) (e.g., additional signal gain is provided by active switching circuit 901).

In one embodiment the $g_m$ stage is further coupled to bias circuit 905 to provide a bias current for amplifier 900. In one embodiment, bias circuit 905 includes a current mirror coupled to a variable resistor $R_v$. Here, the tail current mirror and variable resistor $R_v$ can control the biasing current of amplifier 900. In one embodiment, amplifier 900 includes balanced inductors $L_T$ coupled to the output port $V_o$, e.g., a first inductors $L_T$ is coupled between the output port $V_o^+$ and a voltage supply terminal $V_{DD}$, and a second inductor of a same inductance $L_T$ is coupled between the output port $V_o^-$ and the voltage supply terminal $V_{DD}$. In one embodiment, a variable resistance $R_T$ is coupled between the balanced output ports ($V_o^+$, $V_o^-$). Note that amplifier 900 can be frequency-tuned by selecting an inductance value of $L_T$ and a gain of amplifier 900 can be tuned by adjusting a value of the variable resistance $R_T$.

Figure 10:
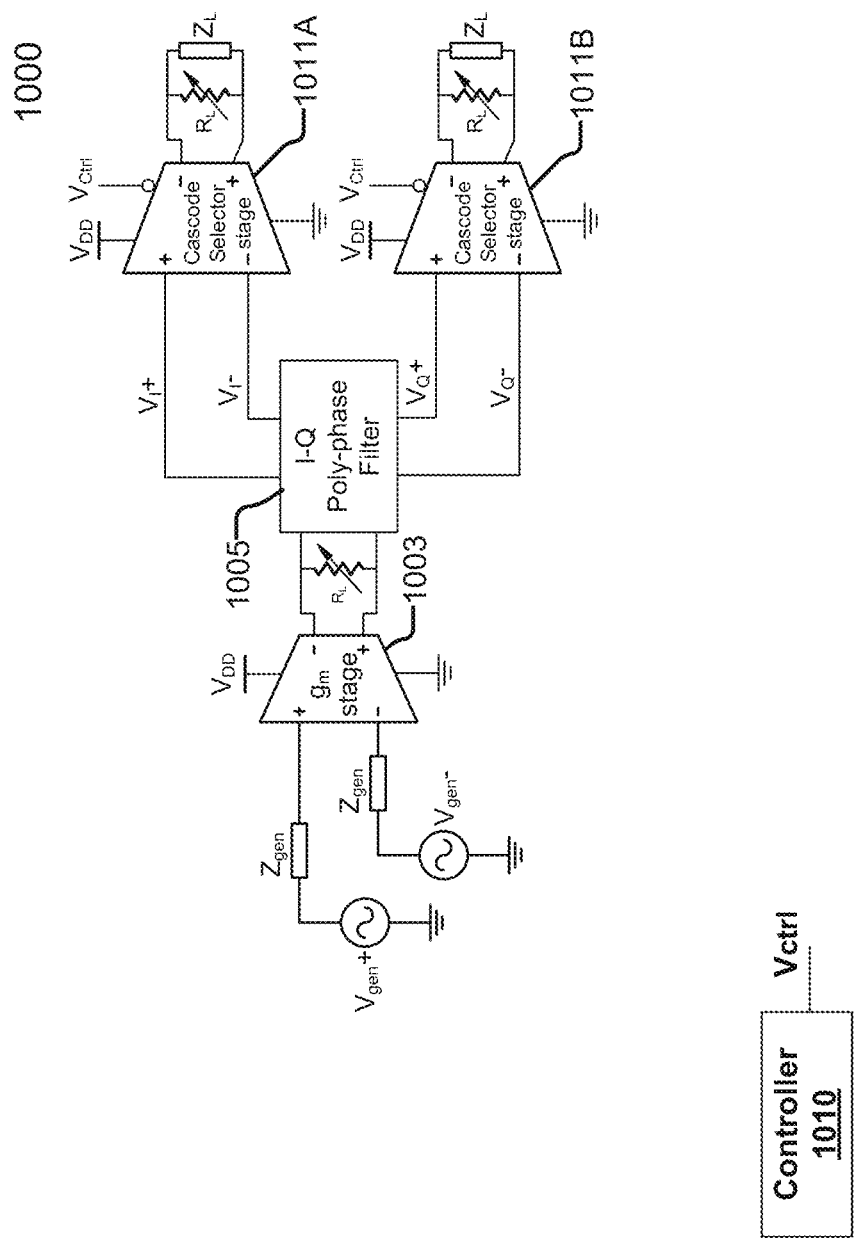
FIG. 10 illustrates a block diagram of an active phase switching transmit IQ amplifier according to one embodiment.
Figure 11:
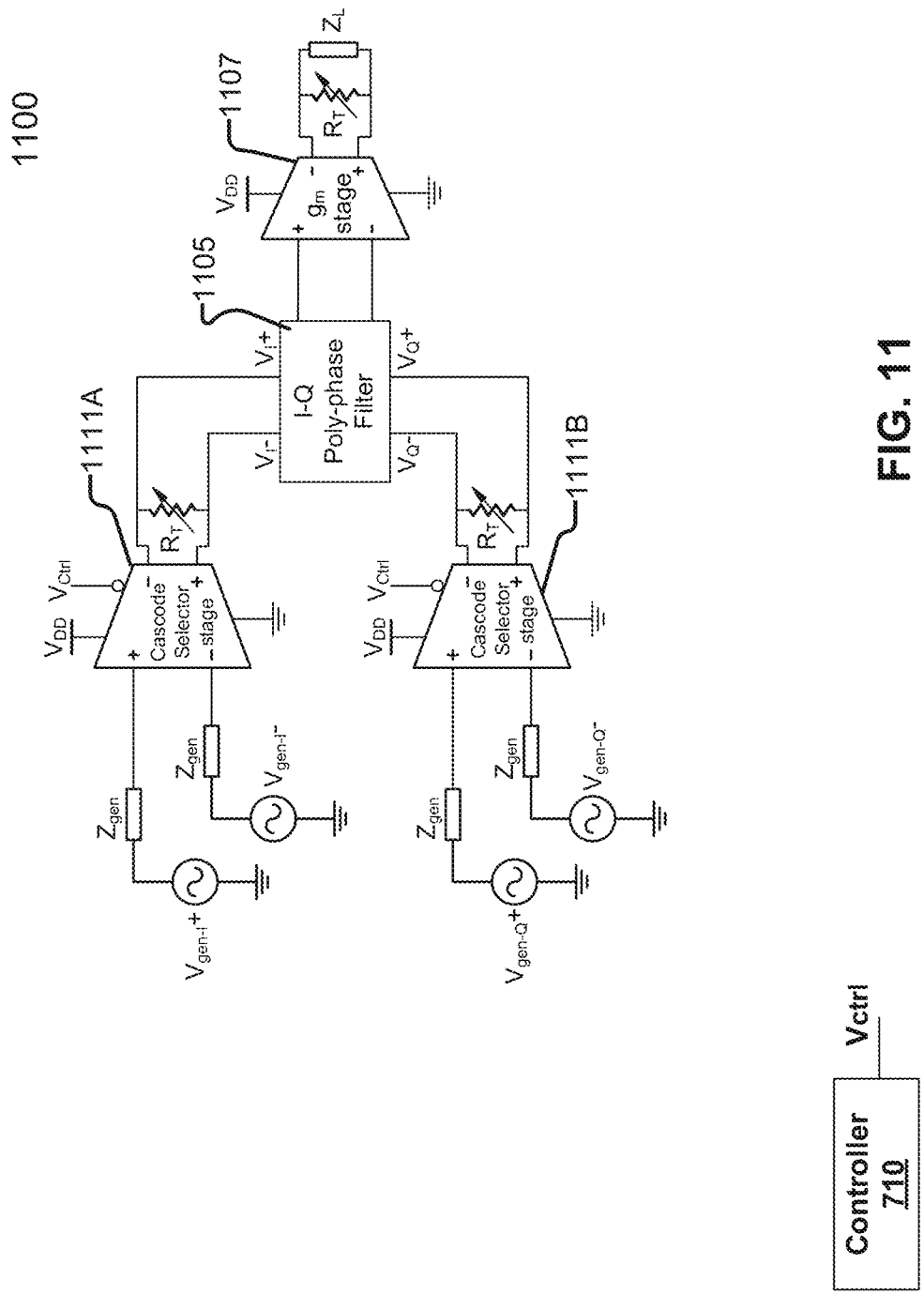
FIG. 11 illustrates a block diagram of an active phase switching receive IQ amplifier according to one embodiment.

FIGS. 10 and 11 illustrate an active phase switching transmit IQ amplifier 1000 and an active phase switching receive IQ amplifier 1100, respectively, according to some embodiments. Transmit IQ amplifier 1000 and receive IQ amplifier 1100 can represent transmit IQ amplifier 700 and receive IQ amplifiers 800 of FIGS. 7-8, but with active switching. For example, instead of using a passive switching network and a $g_m$ stage, active switching is implemented using a current-select cascode gm-stage, such as current-select cascode gm-stage 900 of FIG. 9, and are coupled to the I/Q signal paths after the IQ poly-phase filter of transmit amplifier 1000 and/or before the IQ poly-phase filter of receive amplifier 1100.

As shown in FIG. 10, amplifier 1000 includes a $g_m$ stage 1003 that is common to both I and Q signal paths. $g_m$ stage 1003 receives a balanced (differential) input signal and amplifies the input signal by $g_m*R_T$. $g_m$ stage 703 is coupled to IQ poly-phase filter 1005 to provide the amplified signal to filter 1005. Filter 1005 then generates a four phase signal ($I^+$, $Q^+$, $I^-$, and $Q^-$), e.g., the I and Q signals, using the amplified signal.

For the I signal path, I phase switching gain stage 1011A receives the in-phase (I) signal and outputs an amplified phase switching I signal. For the Q signal path, Q phase switching gain stage 1011B receives the Q signal and outputs an amplified phase switching Q signal.

In one embodiment, I phase switching gain stage 1011A includes a first cascode selector stage, such as cascode selector stage 900 of FIG. 9. In one embodiment, Q phase switching gain stage 1011B includes a second cascode selector stage, such as cascode selector stage 900 of FIG. 9.

Referring to FIG. 11, amplifier 1100 includes, for the I signal path, I phase switching gain stage 1111A. I phase switching gain stage 1111A receives an input signal (e.g., signal from output of I-path mixer) and outputs an amplified phase switching I signal ($I^+$, $I^-$). For the Q signal path, amplifier 1100 includes Q phase switching gain stage 1111B that receives an input signal ((e.g., signal from output of Q-path mixer)) and outputs an amplified phase switching Q signal ($Q^+$, $Q^-$).

In one embodiment, I phase switching gain stage 1111A includes a cascode selector stage, such as cascode selector stage 900 of FIG. 9. In one embodiment, Q phase switching gain stage 1111B includes another cascode selector stage, such as cascode selector stage 900 of FIG. 9.

In one embodiment, I phase switching gain stage 1111A and Q phase switching gain stage 1111B are coupled to IQ poly-phase filter 1105 to provide the amplified I and/or Q phase switching signal to filter 1105 and IQ poly-phase filter 1105 combines the I and Q signals ($I^+$, $Q^+$, $I^-$, and $Q^-$) into a balanced signal. Amplifier 1100 includes a $g_m$ stage 1107 coupled to IQ poly-phase filter 1105 to receive the balanced signal and to generate an amplified balanced signal. The $g_m$ stage 1107 is common to both the I and Q signal paths and amplifies a received signal by $g_m*R_T$.

Therefore, having the current-select cascode gm-stages (e.g., block 1011A, 1011B, and 1111A, 1111B), losses due to passive switching signal attenuation (>0 dB loss) can be eliminated for amplifiers 1000, 1100. Amplifiers 1000, 1100, thus, potentially have a gain increase but may have lower gain linearity, which may require an increase in the supply voltage $V_{DD}$ to preserve output signal swings for amplifiers (1000, 1100). Further, the power consumption of amplifiers (1000, 1100) may potentially be greater than that of the passive switching amplifiers (700, 800).

Figure 12:
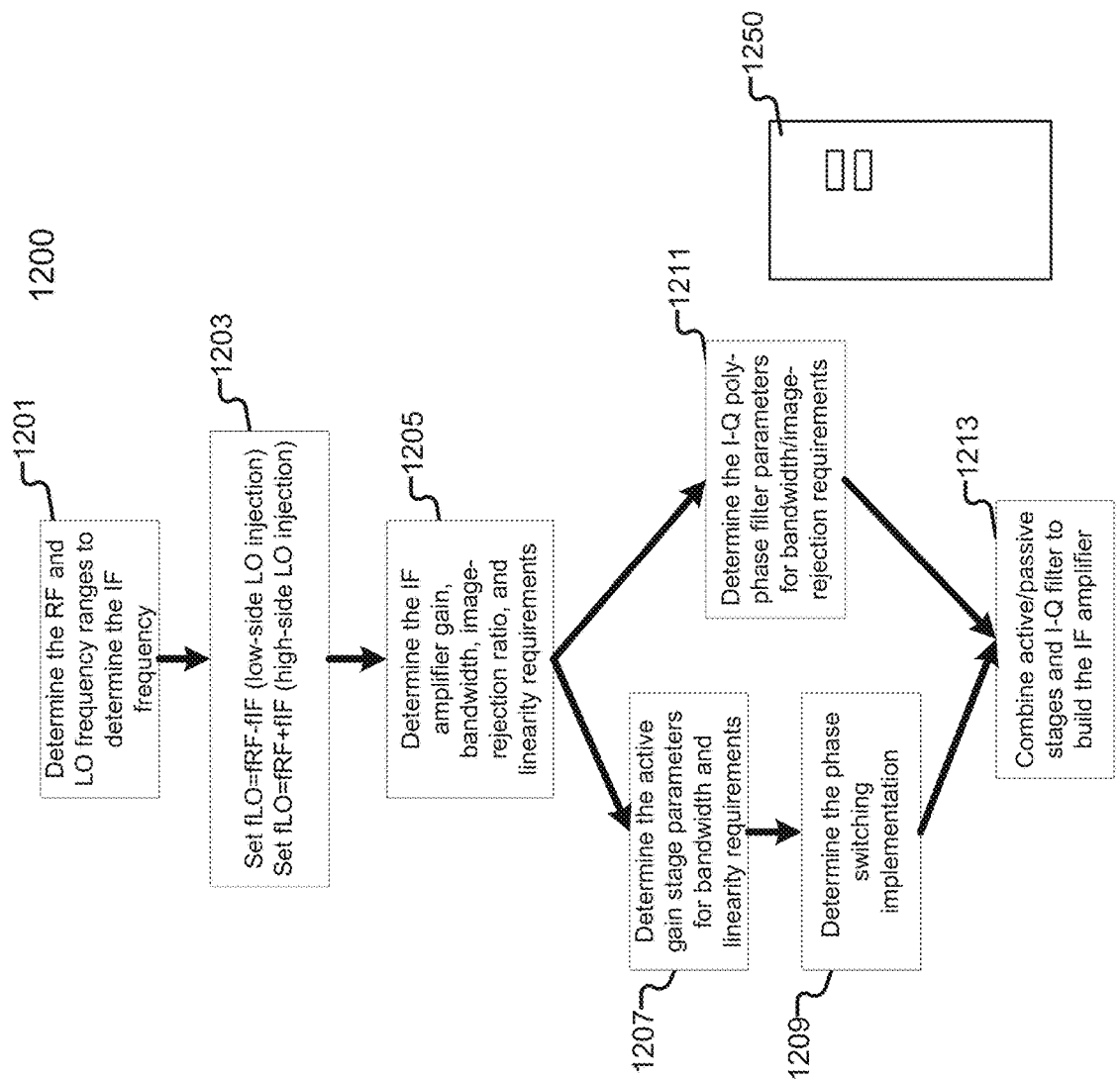
FIG. 12 illustrates a flow diagram of a design method according to one embodiment.

FIG. 12 is a flow diagram illustrating a process to design a phase switching transmit/receive IF amplifiers according to one embodiment. Process 1200 may be performed by processing logic of computer 1250 which may include software, hardware, or a combination thereof.

Referring to FIG. 12, at operation 1201, processing logic determines the RF and LO frequency ranges to determine the IF frequency of a transceiver, based on the frequency of operation for an RF device. For example, based on requirements of an RF device, processing logic can determine the RF frequency for full-band continuous coverage to be 24.5 GHz-43 GHz, and the LO frequencies can be frequency ranges 24.5 GHz-29.5 GHz and 37 GHz-43 GHz. In this case, processing logic can determine the IF frequency to be 7.5 GHz.

At block 1203, processing logic sets the LO frequency to be freq_LO=freq_RF−freq_IF (for low-side LO injection) and freq_LO=freq_RF+freq_IF (for high-side LO injection).

At block 1205, processing logic determines the IF amplifier gain, bandwidth, image-rejection ratio, and linearity requirements for the transmit/receive IF amplifiers. For example, the requirements can be determined based on free space path loss (gain requirement), and specification of the transceiver (bandwidth requirements, image-rejection ratio, and linearity requirements).

At block 1207, based on the amplifier requirements, processing logic can set the active gain stage parameters for bandwidth and linearity requirements of amplifiers.

At block 1209 processing logic determines the phase switching implementation. For example, based on the gain and linearity requirements, processing logic can select either passive phase switching (circuits in FIGS. 7-8) or active phase switching (circuits in FIGS. 10-11). In one embodiment, if amplifier gain is the predominant design factor, processing logic selects the active phase switching. If amplifier linearity is the predominant design factor processing logic selects the passive phase switching.

At block 1211, processing logic determines the filter parameters of the IQ poly-phase filter for the bandwidth/image-rejection requirements, and selects either a RC or RL implementation, and the respective RC or RL components for the IQ poly-phase filter.

At block 1213, processing logic combines the active/passive phase switching stages and the IQ poly-phase filter to implement the transmit/receive IF amplifier.

Additional embodiments of the active phase switching transmit/receive IF amplifiers are possible. For example, the IQ poly-phase filter can be stacked with an active switching network as illustrated in FIGS. 13-14.

Figure 13:
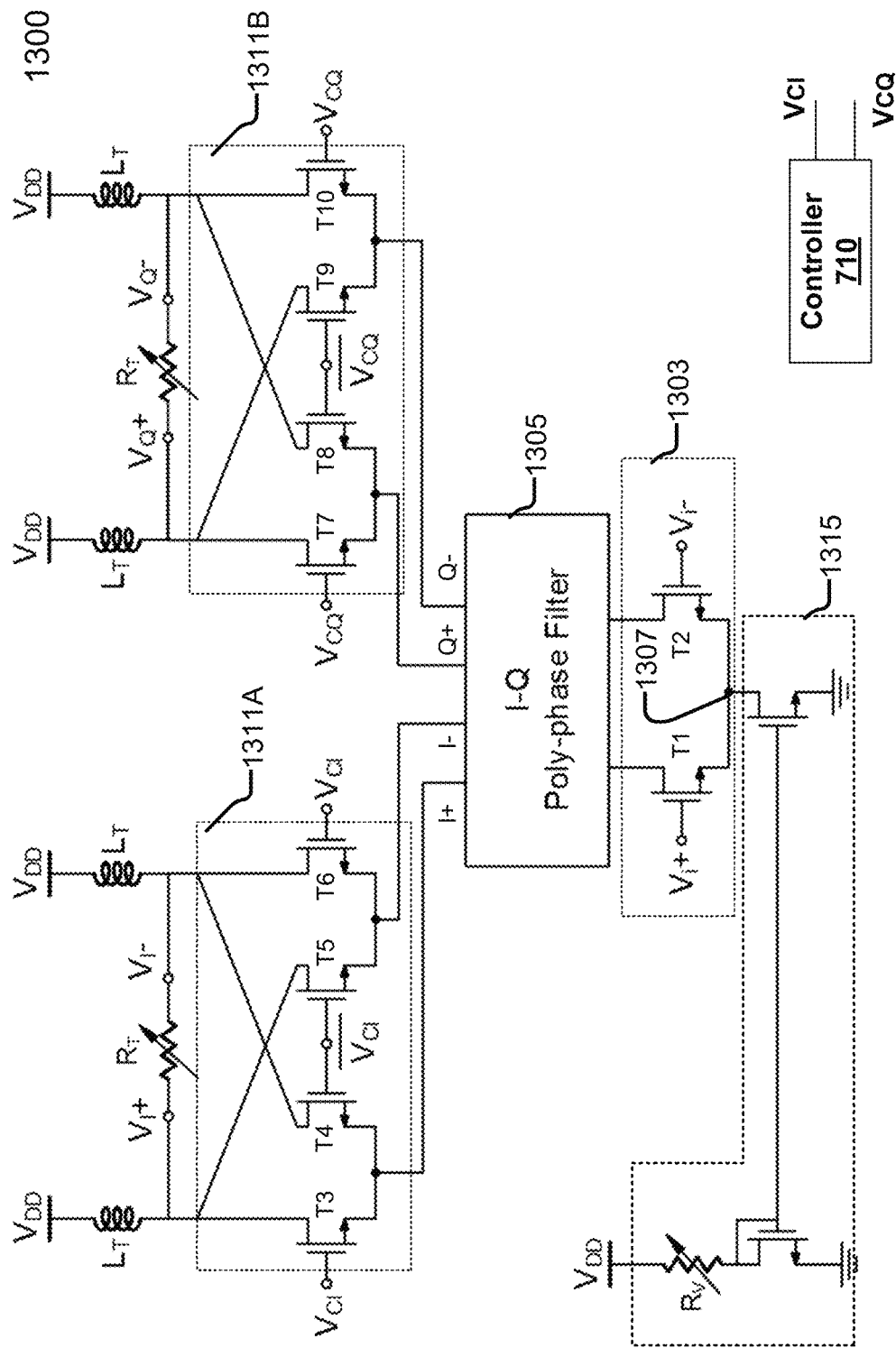
FIG. 13 illustrates a block diagram of a stacked current-selector transmit IQ amplifier according to one embodiment.
Figure 14:
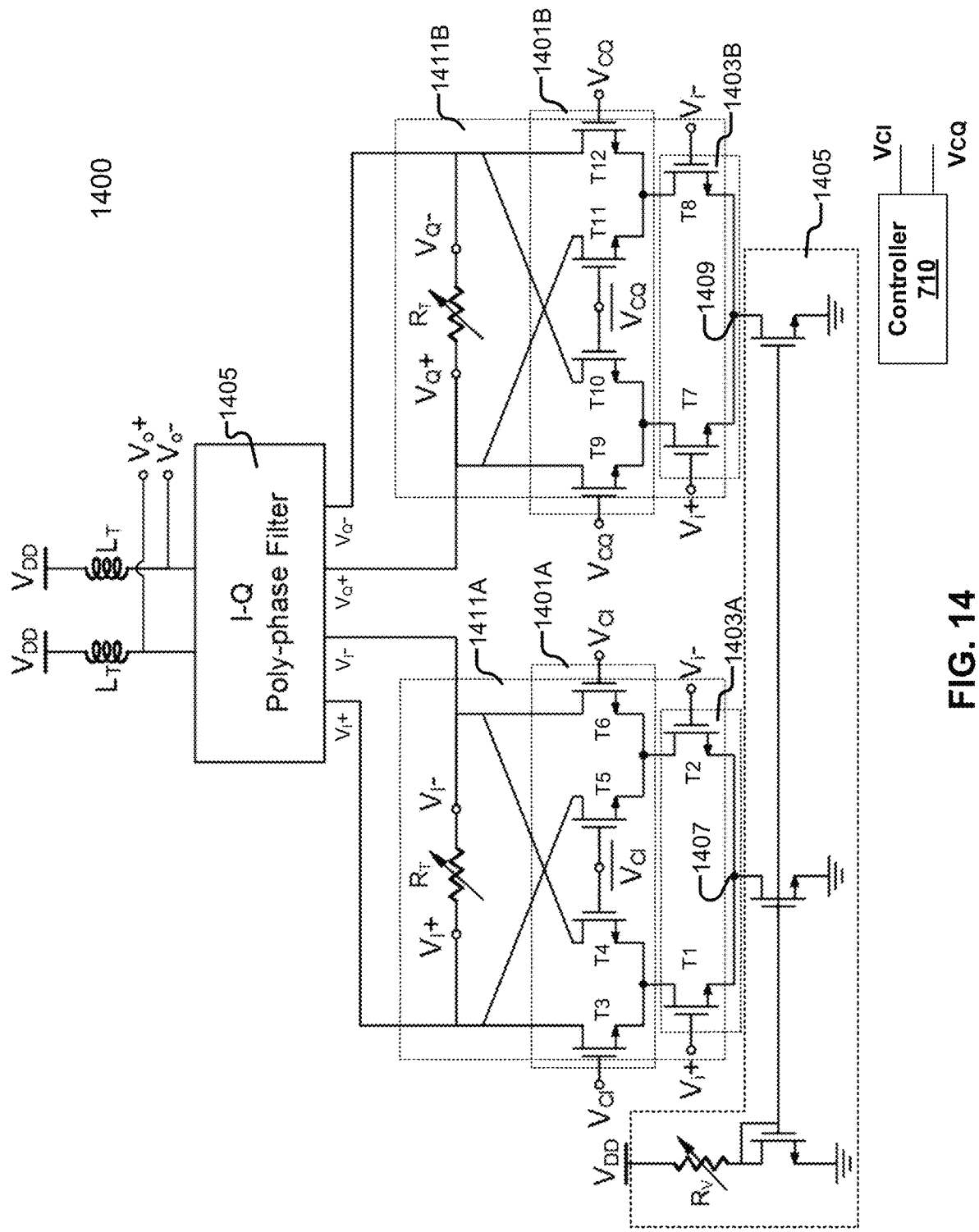
FIG. 14 illustrates a block diagram of a stacked current-selector receive IQ amplifier according to one embodiment.

Referring to FIG. 13, shows a stacked transmit IQ amplifier 1300 according to one embodiment. Amplifier 1300 can represent transmit IQ amplifier 1000 of FIG. 10. Referring to FIG. 13, some components of amplifier 1300 (e.g., the $g_m$ stage, bias circuit in the cascode selector stages) are staked (e.g., eliminated to reduce a footprint of amplifier 1300). The stacking of either active or passive components can reduce a physical area occupied by amplifier 1300, however, the stacking limits the linearity of the amplifier. Thus, a higher supply voltage $V_{DD}$ may be required to mitigate the linearity degradation.

Referring to FIG. 13, in one embodiment, transmit IQ amplifier 1300 includes trans-conductance stage 1303 to receive a balanced input signal ($V_i^+$, $V_i^-$) and to output an amplified signal, an IQ poly-phase filter 1305 coupled to the trans-conductance stage 1303 to receive the amplified signal and to generate a four-phase signal ($I^+$, $Q^+$, $I^-$, $Q^-$), a I phase switching stage 1311A coupled to the IQ poly-phase filter 1305 to receive I component ($I^+$, $I^-$), of the four-phase signal and to generate a phase switching I signal at output ports ($V_I^+$, $V_I^-$), and a quadrature (Q) phase switching stage 1311B coupled to the IQ poly-phase filter 1305 to receive Q component ($Q^+$, $Q^-$) of the four-phase signal and to generate a phase switching Q signal at output ports ($V_Q^+$, $V_Q^-$).

In one embodiment, trans-conductance stage 1303 includes transistors T1 and T2, each having source terminals coupled to node 1307, gate terminals to receive the corresponding component of the balanced input signal ($V_I^+$, $V_I^-$). I phase switching stage 1311A includes transistors T3 and T4, each having source terminals to receive I+ component of the four-phase signal, a gate terminal of transistor T3 is coupled to an I control voltage ($V_{CI}$), a gate terminal of transistor T4 is coupled to an I control_bar voltage ($C_{CI\_bar}$), a drain terminal of transistor T3 is coupled to the output port ($V_I^+$), and a drain terminal of transistor T4 is coupled to the output port ($V_I^-$). I phase switching stage 1311A includes transistors T5 and T6, each having source terminals coupled to receive I– component of the four-phase signal, gate terminal of transistor T5 is coupled to an I control_bar voltage ($V_{CI\_bar}$), gate terminal of transistor T6 is coupled to an I control voltage ($V_{CI}$), drain terminal of transistor T5 is coupled to the output port ($V_I^+$), and drain terminal of transistor T6 is coupled to the output port ($V_I^-$).

The Q phase switching stage 1311B includes transistors T7 and T8, each having source terminals to receive $Q^+$ component of the four-phase signal, a gate terminal of the transistor T7 is coupled to a Q control voltage ($V_{CQ}$), a gate terminal of the transistor T8 is coupled to a Q control_bar voltage ($V_{CQ\_bar}$), a drain terminal of the transistor T7 is coupled to the output port ($V_Q^+$), and a drain terminal of transistor T8 is coupled to the output port ($V_Q^-$); and transistors T9 and T10, each having source terminals to receive $Q^-$ component of the four-phase signal, a gate terminal of transistor T9 is coupled to a Q control_bar voltage ($V_{CQ\_bar}$), a gate terminal of transistor T10 is coupled to a Q control voltage ($V_{CQ}$), a drain terminal of transistor T9 is coupled to the output port ($V_Q^+$), and a drain terminal of transistor T10 is coupled to the output port ($V_Q^-$).

In one embodiment, amplifier 1300 includes controller 710 to provide I and Q component control signals ($V_{CI}$, $V_{CQ}$) to control the phase switching of circuit blocks 1311A, 1311B. For example, as previously described, either I or Q signal is phase switched during the time intervals of high LO injection to provide dual band continuous time image rejection for a dual band frequency range, such as 24.5-43 GHz.

In one embodiment, amplifier 1300 includes a bias circuit 1315 coupled to node 1307 to provide a biasing current, where the biasing current is tunable by adjusting resistance $R_\nu$. Furthermore, the frequency ranges of amplifier 1300 can be tuned by selecting the inductance value $L_T$ and a gain of amplifier 1300 can be adjusted by adjusting variable resistance $R_T$.

FIG. 14 illustrates a stacked receive IQ amplifier 1400 according to one embodiment. Amplifier 1400 can represent receive IQ amplifier 1100 of FIG. 11. Referring to FIG. 14, some components in amplifier 1400 (e.g., the $g_m$ stage in the signal path that is after the IQ poly-phase) are staked. As described above, the stacking although potentially minimize a physical area occupied by the amplifier. The stacking, however, limits the linearity performance of the amplifier.

Referring to FIG. 14, receive IQ amplifier 1400 includes I phase switching gain stage 1411A to receive a balanced input signal and to generate an amplified phase switching I signal at output ports ($V_I^+$, $V_I^-$), Q phase switching gain stage 1411B to receive the balanced input signal and to generate an amplified phase switching Q signal at output ports ($V_Q^+$, $V_Q^-$), and IQ poly-phase filter 1405 coupled to the I and Q phase switching gain stages (1411A, 1411B) to receive corresponding phase switching I and Q signals and to output a balanced signal.

In one embodiment, I phase switching gain stage 1411A includes trans-conductance stage 1403A that includes transistors T1 and T2, each having source terminals coupled to node 1407, gate terminals to receive a corresponding component of the balanced input signal ($V_i^+$, $V_i^-$). I phase switching gain stage 1411A includes first active switching circuit 1401A coupled to the first trans-conductance stage, the active switching circuit 1401A includes transistors T3 and T4, each having source terminals coupled to a drain terminal of transistor T1, a gate terminal of transistor T3 is coupled to an I control voltage ($V_{CI}$), a gate terminal of transistor T4 is coupled to an I control_bar voltage ($V_{CI\_bar}$), a drain terminal of transistor T3 is coupled to a first output port ($V_I^+$), and a drain terminal of transistor T4 is coupled to a second output port ($V_I^-$).

Active switching circuit 1401A includes transistors T5 and T6, each having source terminals coupled to a drain terminal of transistor T2, a gate terminal of transistor T5 is coupled to an I control_bar voltage ($V_{CI\_bar}$), a gate terminal of transistor T6 is coupled to an I control voltage ($V_{CI}$), a drain terminal of transistor T5 is coupled to the first output port ($V_I^+$), and a drain terminal of transistor T6 is coupled to the second output port ($V_I^-$).

In one embodiment, Q phase switching gain stage 1411B includes a trans-conductance stage 1403B that includes transistors T7 and T8, each having source terminals coupled to node 1409, gate terminals to receive a corresponding component of the balanced input signal ($V_I^+$, $V_I^-$), and active switching circuit 1401B coupled to trans-conductance stage 1403B. The active switching circuit 1401B includes transistors T9 and T10, each having source terminals coupled to a drain terminal of transistor T7, a gate terminal of transistor T9 is coupled to a Q control voltage ($V_{CQ}$), a gate terminal of transistor T10 is coupled to a Q control_bar voltage ($V_{CQ\_bar}$), a drain terminal of transistor T9 is coupled to a third output port ($V_Q^+$), and a drain terminal of transistor T10 is coupled to a fourth output port ($V_Q^-$).

Active switching circuit 1401B includes transistors T11 and T12, each having source terminals coupled to a drain terminal of transistor T8, a gate terminal of transistor T11 is coupled to a Q control_bar voltage ($V_{CQ\_bar}$), a gate terminal of transistor T12 is coupled to a Q control voltage ($V_{CQ}$), a drain terminal of transistor T11 is coupled to the third output port ($V_Q^+$), and a drain terminal of transistor T12 is coupled to the fourth output port ($V_Q^-$).

In one embodiment, amplifier 1400 includes controller 710 to provide I and Q component control signals ($V_{CI}$, $V_{CQ}$) to control the phase switching of the active switching circuits 1401A, 1401B. For example, as previously described, either I or Q signal is phase switched during the time intervals of high LO injection to provide dual band continuous time image rejection for a dual band frequency range, such as 24.5-43 GHz.

In one embodiment, amplifier 1400 includes a bias circuit 1405 coupled to nodes (1407, 1409) to provide biasing currents, where the biasing currents are tunable by adjusting resistance $R_v$. Furthermore, the frequency ranges of amplifier 1400 can be tuned by selecting the inductance value $L_T$ and a gain of amplifier 1400 can be adjusted by adjusting variable resistance $R_T$.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A transmit in-phase quadrature (IQ) amplifier, comprising:
    a common gain stage to receive an input signal and to generate an amplified signal;
    an in-phase quadrature (IQ) poly-phase filter coupled to the common gain stage to receive the amplified signal from the common gain stage and outputs a four-phase signal;
    an in-phase (I) phase switching gain stage coupled to the IQ poly-phase filter to receive I components of the four-phase signal and outputs an amplified phase switching I signal; and
    a quadrature (Q) phase switching gain stage coupled to the IQ poly-phase filter to receive Q components of the four-phase signal and outputs an amplified phase switching Q signal,
    wherein the I or Q phase switching gain stage comprises a passive phase switching component or an active phase switching component.

2. The transmit IQ amplifier of claim 1, wherein the I or Q phase switching gain stage comprises:
    a double-pole double-throw switch to receive either the I or Q components of the four-phase signal and generates a phase switching I or Q signal; and
    a trans-conductance amplifier coupled to the doubled-pole double-throw switch to receive the phase switching I or Q signal from the doubled-pole double-throw switch and outputs the amplified phase switching I or Q signal.

3. The transmit IQ amplifier of claim 2, wherein the double-pole double-throw switch comprises two fully-differential single-pole single-throw switches.

4. The transmit IQ amplifier of claim 1, wherein the I or Q phase switching gain stage comprises a cascode selector amplifier.

5. The transmit IQ amplifier of claim 4, wherein the cascode selector amplifier comprises:
    a trans-conductance stage to receive a balanced input signal ($V_i^+$, $V_i^-$) and generates an amplified signal;
    an active switching circuit coupled to the trans-conductance stage to receive the amplified signal from the trans-conductance stage and outputs a balanced phase switching signal at output ports ($V_o^+$, $V_o^-$); and
    a biasing circuit coupled to the trans-conductance stage to provide a variable bias signal to the trans-conductance stage.

6. The transmit IQ amplifier of claim 5, wherein the trans-conductance stage comprises a first and a second transistors, each having source terminals coupled to a common node that is coupled to the biasing circuit, gate terminals to receive a corresponding component of the balanced input signal ($V_i^+$, $V_i^-$), and drain terminals coupled to the active switching circuit.

7. The transmit IQ amplifier of claim 5, wherein the active switching circuit comprises:
    a third and a fourth transistors, each having source terminals coupled to a drain terminal of a first transistor, a gate terminal of the third transistor is coupled to a control voltage ($V_c$), a gate terminal of the fourth transistor is coupled to a control_bar voltage ($V_{c\_bar}$), a drain terminal of the third transistor is coupled to the output port ($V_o^+$), and a drain terminal of the fourth transistor is coupled to the output port ($V_o^-$); and
    a fifth and a sixth transistors, each having source terminals coupled to a drain terminal of a second transistor, a gate terminal of the fifth transistor is coupled to a control_bar voltage ($V_{c\_bar}$), a gate terminal of the sixth transistor is coupled to a control voltage ($V_c$), a drain terminal of the fifth transistor is coupled to the output port ($V_o^+$), and a drain terminal of the sixth transistor is coupled to the output port ($V_o^-$).

8. The transmit IQ amplifier of claim 1, further comprising a controller to generate a control voltage ($V_c$) to control a phase switching of either the I or Q phase switching gain stage.

9. The transmit IQ amplifier of claim 1, wherein the I or Q phase switching gain stage comprises:
    a variable resistance coupled between output ports ($V_o^+$, $V_o^-$) of the I or Q phase switching gain stage to tune a gain of the I or Q phase switching gain stage;
    a first inductance between output port $V_o^+$ and a supply voltage terminal to tune an operating frequency of the I or Q phase switching gain stage; and
    a second inductance between output port $V_o^-$ and the supply voltage terminal to tune an operating frequency of the I or Q phase switching gain stage.

10. A receive in-phase quadrature (IQ) amplifier, comprising:
    an in-phase (I) phase switching gain stage to receive an I component of an input signal and to generate an amplified phase switching I signal;

a quadrature (Q) phase switching gain stage to receive a Q component of the input signal and to generate an amplified phase switching Q signal;

an in-phase quadrature (IQ) poly-phase filter coupled to the I and Q phase switching gain stages to receive the amplified phase switching I and Q signals and outputs a balanced signal; and a common gain stage coupled to the IQ poly-phase filter to receive the balanced signal from the IQ poly-phase filter and outputs an amplified balanced signal, wherein the I or Q phase switching gain stage comprises a passive phase switching component or an active phase switching component.

11. The receive IQ amplifier of claim 10, wherein the I or Q phase switching gain stage comprises:

a double-pole double-throw switch to receive either the I or Q components of the input signal and to generate a phase switching I or Q signal; and a trans-conductance amplifier coupled to the doubled-pole double-throw switch to receive the phase switching I or Q signal from the doubled-pole double-throw switch and outputs the amplified phase switching I or Q signal.

12. The receive IQ amplifier of claim 11, wherein the double-pole double-throw switch comprises two fully-differential single-pole single-throw switches.

13. The receive IQ amplifier of claim 10, wherein the I or Q phase switching gain stage comprises a cascode selector amplifier.

14. The receive IQ amplifier of claim 13, wherein the cascode selector amplifier comprises:

a trans-conductance stage to receive a balanced input signal ($V_i^+$, $V_i^-$) and generates an amplified signal;

an active switching circuit coupled to the trans-conductance stage to receive the amplified signal from the trans-conductance stage and outputs a balanced phase switching signal at output ports ($V_o^+$, $V_o^-$); and a biasing circuit coupled to the trans-conductance stage to provide a variable bias signal to the trans-conductance stage.

15. The receive IQ amplifier of claim 14, wherein the trans-conductance stage comprises a first and a second transistors, each having source terminals coupled to a common node that is coupled to the biasing circuit, gate terminals to receive a corresponding component of the balanced input signal ($V_i^+$, $V_i^-$), and drain terminals coupled to the active switching circuit.

16. The receive IQ amplifier of claim 14, wherein the active switching circuit comprises:

a third and a fourth transistors, each having source terminals coupled to a drain terminal of a first transistor, a gate terminal of the third transistor is coupled to a control voltage ($V_c$), a gate terminal of the fourth transistor is coupled to a control_bar voltage ($V_{c\_bar}$), a drain terminal of the third transistor is coupled to the output port ($V_o^+$), and a drain terminal of the fourth transistor is coupled to the output port ($V_o^-$); and a fifth and a sixth transistors, each having source terminals coupled to a drain terminal of a second transistor, a gate terminal of the fifth transistor is coupled to a control_bar voltage ($V_{c\_bar}$), a gate terminal of the sixth transistor is coupled to a control voltage ($V_c$), a drain terminal of the fifth transistor is coupled to the output port ($V_o^+$), and a drain terminal of the sixth transistor is coupled to the output port ($V_o^-$).

17. A receive in-phase quadrature (IQ) amplifier, comprising:

an in-phase (I) phase switching gain stage to receive a balanced input signal and to generate an amplified phase switching I signal at ports ($V_I^+$, $V_I^-$);

a quadrature (Q) phase switching gain stage to receive the balanced input signal and to generate an amplified phase switching Q signal at ports ($V_Q^+$, $V_Q^-$); and an in-phase quadrature (IQ) poly-phase filter coupled to the I and Q phase switching gain stages to receive the phase switching I and Q signals and to output a balanced signal ($V_O^+$, $V_O^-$), wherein the I phase switching gain stage comprises:

a first trans-conductance stage, comprising a first and a second transistors, each having source terminals coupled to a first common node, gate terminals to receive a corresponding component of the balanced input signal ($V_i^+$, $V_i^-$), and a first active switching circuit coupled to the first trans-conductance stage.

18. The receive IQ amplifier of claim 17, wherein the first active switching circuit comprises:

a third and a fourth transistors, each having source terminals coupled to a drain terminal of the first transistor, a gate terminal of the third transistor is coupled to an I control voltage ($V_{CI}$), a gate terminal of the fourth transistor is coupled to an I control_bar voltage ($V_{CI\_bar}$), a drain terminal of the third transistor is coupled to the port ($V_I^+$), and a drain terminal of the fourth transistor is coupled to the port ($V_I^-$); and a fifth and a sixth transistors, each having source terminals coupled to a drain terminal of the second transistor, a gate terminal of the fifth transistor is coupled to the I control_bar voltage ($V_{CI\_bar}$), a gate terminal of the sixth transistor is coupled to the I control voltage ($V_{CI}$), a drain terminal of the fifth transistor is coupled to the port ($V_I^+$), and a drain terminal of the sixth transistor is coupled to the port ($V_I^-$).

19. The receive IQ amplifier of claim 17, wherein the Q phase switching gain stage comprises:

a second trans-conductance stage, comprising a seventh and an eight transistors, each having source terminals coupled to a second common node, gate terminals to receive a corresponding component of the balanced input signal ($V_I^+$, $V_i^-$); and a second active switching circuit coupled to the second trans-conductance stage.

20. The receive IQ amplifier of claim 19, wherein the second active switching circuit comprises:

a ninth and a tenth transistors, each having source terminals coupled to a drain terminal of the seventh transistor, a gate terminal of the ninth transistor is coupled to a Q control voltage ($V_{CQ}$), a gate terminal of the tenth transistor is coupled to a Q control_bar voltage ($V_{CQ\_bar}$), a drain terminal of the ninth transistor is coupled to the port ($V_Q^+$), and a drain terminal of the tenth transistor is coupled to the port ($V_Q^-$); and an eleventh and a twelfth transistors, each having source terminals coupled to a drain terminal of the eighth transistor, a gate terminal of the eleventh transistor is coupled to the Q control_bar voltage ($V_{CQ\_bar}$), a gate terminal of the twelfth transistor is coupled to the Q control voltage ($V_{CQ}$), a drain terminal of the eleventh transistor is coupled to the port ($V_Q^+$), and a drain terminal of the twelfth transistor is coupled to the port ($V_Q^-$).

\* \* \* \* \*